(12) United States Patent
Peng et al.

(10) Patent No.: US 11,664,311 B2
(45) Date of Patent: May 30, 2023

(54) METHOD AND STRUCTURE TO REDUCE CELL WIDTH IN SEMICONDUCTOR DEVICE

(71) Applicant: TAIWAN SEMICONDUCTOR MANUFACTURING COMPANY LTD., Hsinchu (TW)

(72) Inventors: Shih-Wei Peng, Hsinchu (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 227 days.

(21) Appl. No.: 16/746,046

(22) Filed: Jan. 17, 2020

(65) Prior Publication Data

US 2021/0225768 A1    Jul. 22, 2021

(51) Int. Cl.
  *H01L 21/02*    (2006.01)
  *H01L 23/528*    (2006.01)
  (Continued)

(52) U.S. Cl.
  CPC ........ *H01L 23/5286* (2013.01); *G06F 30/392* (2020.01); *H01L 21/0217* (2013.01); *H01L 21/0274* (2013.01); *H01L 21/76224* (2013.01); *H01L 21/823437* (2013.01); *H01L 21/823468* (2013.01); *H01L 21/823475* (2013.01); *H01L 21/823481* (2013.01); *H01L 23/5226* (2013.01); *H01L 27/088* (2013.01); *H01L 29/0673* (2013.01); *H01L 29/42392* (2013.01); *H01L 21/31053* (2013.01)

(58) Field of Classification Search
  USPC ...................................................... 257/401
  IPC ................... H01L 23/5286,21/0217, 21/027,
       21/76224, 21/823437, 21/823468,
       21/823475, 21/823481, 23/5226,
       27/088, 29/0673, 29/42392,
       21/31053
  See application file for complete search history.

(56) References Cited

U.S. PATENT DOCUMENTS 10,658,650 B2 * 5/2020 Shibutani .......... H01M 10/0587
  2011/0297942 A1* 12/2011 Kim .................... H01L 27/3276
                                                                        438/34
  2021/0335710 A1* 10/2021 Cobb .................. H01L 23/5286

OTHER PUBLICATIONS

Merriam Webster—Online Dictionary definition of Cuasing. No Date.*

* cited by examiner

*Primary Examiner* — Hrayr A Sayadian
(74) *Attorney, Agent, or Firm* — WPAT Law; Anthony King

(57) ABSTRACT

A semiconductor device includes a dielectric layer having a first surface and a second surface opposite to the first surface; an active region on the first surface of the dielectric layer; a power rail under the second surface of the dielectric layer, wherein the dielectric layer is between the active region and the power rail; a spacer physically dividing the active region into a first part and a second part, the first part and the second part being conductively isolated from each other by the spacer; an intermediate layer comprising: first and second conductive segments; and wherein the spacer joins the first conductive segment and the second conductive segment, and electrically isolates the first conductive segment from the second conductive segment, wherein a join length between the first conductive segment and the spacer is equal to a join length between the second conductive segment and the spacer.

20 Claims, 26 Drawing Sheets

(51) Int. Cl.
*H01L 27/088* (2006.01)
*G06F 30/392* (2020.01)
*H01L 21/027* (2006.01)
*H01L 29/06* (2006.01)
*H01L 29/423* (2006.01)
*H01L 21/8234* (2006.01)
*H01L 21/762* (2006.01)
*H01L 23/522* (2006.01)
*H01L 21/3105* (2006.01)

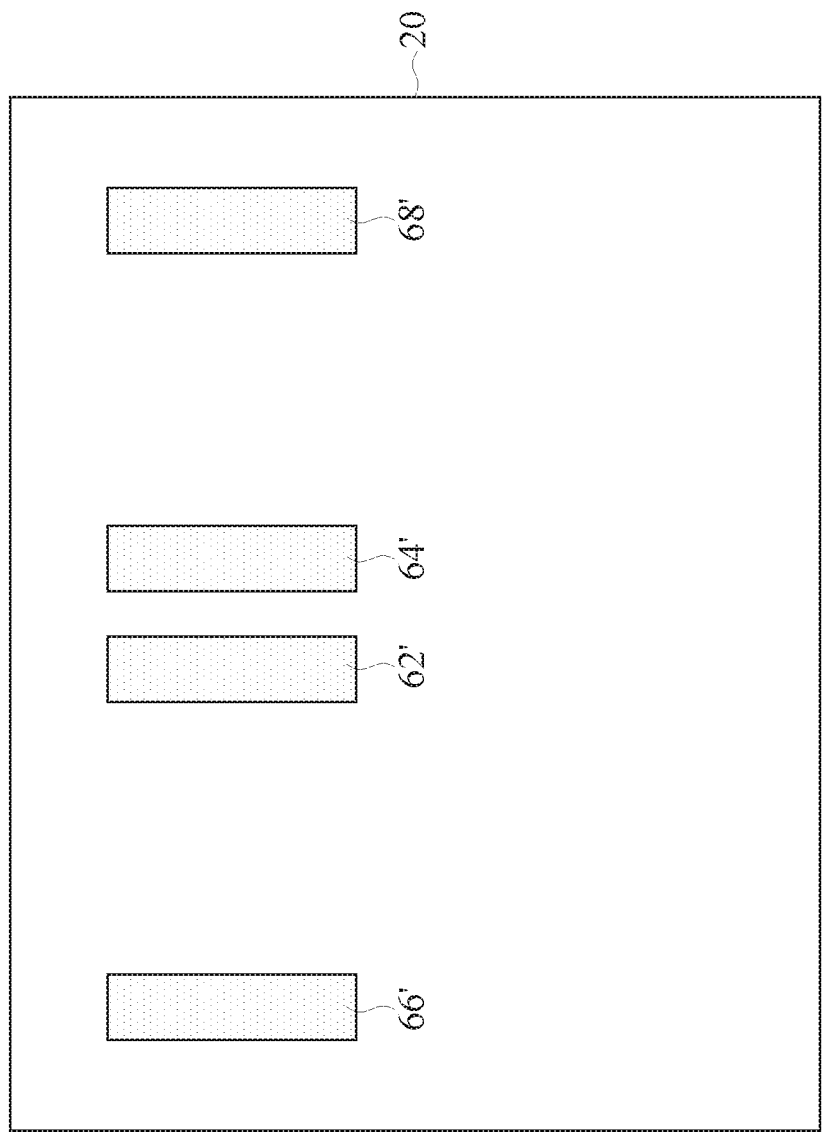

METHOD AND STRUCTURE TO REDUCE CELL WIDTH IN SEMICONDUCTOR DEVICE

BACKGROUND

The recent trend in miniaturizing integrated circuits (ICs) has resulted in smaller devices which consume less power yet provide more functionality at higher speeds. The miniaturization process has also resulted in more strict restriction on the layout design of the ICs. During the layout design of the ICs, functional or physical cells are often placed in a circuit layout and routed to form functional circuits. The size reduction of these cells often increases the circuit density of the IC circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a schematic diagram of a top view of the semiconductor device in FIG. 1 in accordance with some embodiments of the present disclosure.

DETAILED DESCRIPTION

Figure 1:
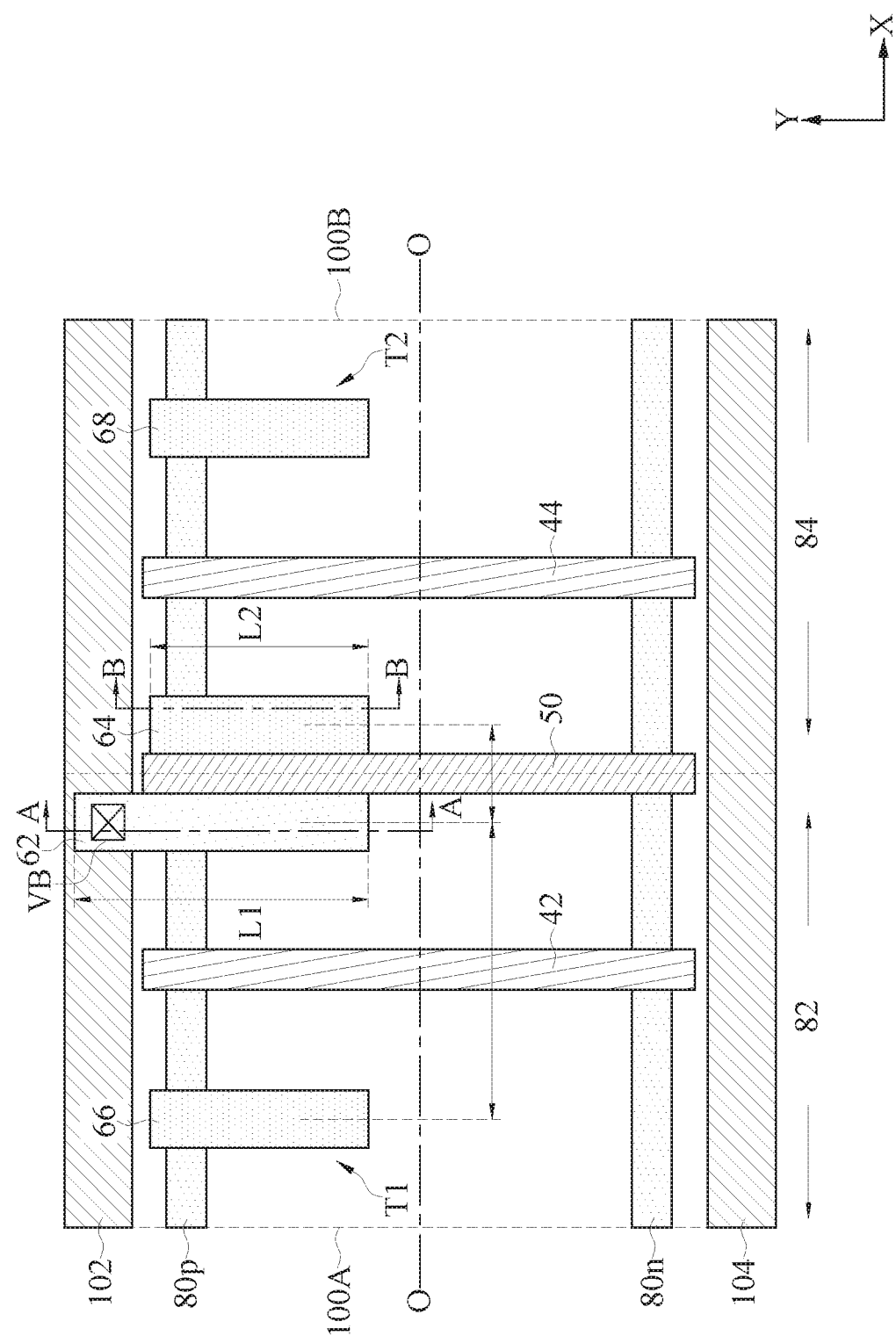
FIG. 1 is a schematic diagram of layout designs for a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of layout designs for a semiconductor device 100, in accordance with some embodiments. Referring to FIG. 1, the semiconductor device 100 as specified by the layout design in FIG. 1 includes active regions 80$n$ and 80$p$ (80$n$ represents an n-type active region, and 80$p$ represents a p-type active region) extending in the X-direction, a spacer 50 extending in the Y-direction, gate-strips 42 and 44 extending in the Y-direction, conductive segments 62, 64, 66 and 68 extending in the Y-direction, and buried power rails 102 and 104 extending in the X-direction. In some embodiments, the n-type active region 80$n$ is parallel to the p-type active region 80$p$ in the X-direction. For brevity, metal lines such as metal lines in a MO layer are not depicted.

In some embodiments, the boundary of each of the active regions 80$n$ and 80$p$ is logically specified by an oxide dimensioning (OD) pattern during the layout process. The active regions 80$n$ and 80$p$ are fabricated using one or more masks in a process that involves oxidation, etching, diffusion, and other steps. For convenience of discussion, the active region 80$p$ is taken as an exemplary example in the following description.

A portion of the active region 80$p$ crossed over by the gate-strip 42 serves as a channel region of a transistor T1 in a cell 100A. In some embodiments, the transistor T1 includes a field effect transistor (FET). Another portion of the active region 80$p$ crossed over by the conductive segment 62 and immediately adjacent to the channel region serves as one of a source region and a drain region of the transistor T1. The other portion of the active region 80$p$ crossed over by the conductive segment 66 and immediately adjacent to the channel region serves as the other one of the source region and the drain region of the transistor T1.

In some embodiments, fin structures in the X-direction are fabricated in the active region 80p, and the gates for Fin-FETs are formed above the channel regions with the gate-strips crossing over the fin structures. In some embodiments, the gates for other type of FETSs are formed above the channel regions when the gate-strips cross over the active region 80p.

In some embodiments, the transistors T1 and T2 include a Nano-sheet structure, or a Nano-wire structure. In some embodiments, a Nano-wire structure includes a gate all around structure.

The conductive segments 62 and 66 crosses over the active region 80p, and serves as a conductive line connecting to the source region and the drain region of the transistor T1, as illustrated in detail with reference to the embodiments of FIGS. 2A and 2B.

A portion of the active region 80p crossed over by the gate-strip 44 serves as a channel region of a transistor T2 in a cell 100B. In some embodiments, the transistor T2 includes a field effect transistor (FET). Another portion of the active region 80p crossed over by the conductive segment 64 and immediately adjacent to the channel region serves as one of a source region and a drain region of the transistor T2. The other portion of the active region 80p crossed over by the conductive segment 68 and immediately adjacent to the channel region serves as the other one of the source region and the drain region of the transistor T2.

The conductive segments 64 and 68 crosses over the active region 80p, and serves as a conductive line connecting to the source region and the drain region of the transistor T2.

In some embodiments, the semiconductor device 100 further includes multiple conductive segments symmetrical to the conductive segments 66, 62, 64 and 68 with respect to a center line O-O. In the present embodiment, the transistors T1 and T2 at one side of the center line O-O are p-type transistors, and other transistors defined by the multiple conductive segments at the other side of the center line O-O are n-type transistors.

The buried power rails 102 and 104 respectively provide a first supply voltage VDD and a second supply voltage VSS. In some embodiments, the buried power rails 102 and 104 are buried power rails that are fabricated in a layer that is below a first metal layer for making conductive routing lines. In other embodiments, the buried power rails 102 and 104 are fabricated in a first metal layer or in another metal layer for making conductive routing lines.

The spacer 50 divides the active region 80p into a first part 82 and a second part 84. The first part 82 and the second part 84 of the active region 80p are conductively isolated from each other by the spacer 50. In some embodiments, before the spacer 50 is fabricated, the active region 80p is fabricated in the form of a continuous oxide diffusion (CNOD) region which does not break at the boundary between two abutting cells for constructing a functional circuit. The spacer 50 that breaks the active region 80p is fabricated from insulating materials. In some embodiments, the spacer 50 is fabricated from silicon nitride (Si3N4). In addition, the spacer 50 physically joins the conductive segment 62 and the conductive segment 64 while preventing conductive contact between the conductive segment 62 and the conductive segment 64.

By way of division of the spacer 50, the transistor T1 is formed in the first part 82 of the active region 80p, and the transistor T2 is formed in the second part 84 of the active region 80p. The spacer 50 is located at a boundary between the cell 100A and the cell 100B, and each of the cell 100A and the cell 100B includes one or more logic functions. It should be noted that the cell 100A may include a plurality of transistors, and not limited to one transistor. The cell 100B may include a plurality of transistors, and not limited to one transistor.

Generally, a design rule regulates a minimum distance between two neighboring conductive segments. For example, a distance between the conductive segment 62 and the conductive segment 66 is the minimum distance; and a distance between the conductive segment 64 and the conductive segment 68 is the minimum distance. To reduce size of the semiconductor device 100, a designer further shortens a distance between two neighboring conductive segments.

A continuous poly on diffusion edge (CPODE) technology to shorten a distance between two neighboring conductive segments is proposed. With CPODE technology, a dummy poly (PO) line is at the vertical cell boundary between the two neighboring conductive segments on either side of the vertical cell boundary separating two abutting cells. With CPODE technology, there is a first space from the dummy PO line to the first one of the two neighboring conductive segments (which is in the first cell), and there is a second space from the dummy PO line to the second one of the two neighboring conductive segments (which is in the second cell). The CPODE technology facilitates to shorten the total cell width of two abutting cells. The reduction of the total cell width improves the circuit density of the IC circuits.

Further, the designer comes up with another feasible approach to remove the dummy PO line to further shorten a cell width. In such approach, a spacer like the spacer 50 is added between two neighboring conductive segments. In this way, a distance between two neighboring conductive segments is decreased. As shown in FIG. 1, a distance between the conductive segment 62 and the conductive segment 64 is shorter than a distance between the conductive segment 62 and the conductive segment 66. In some embodiments, the distance between the conductive segment 62 and the conductive segment 64 is deemed as a first distance. The distance between the conductive segment 62 and the conductive segment 66 is deemed as a second distance. A ratio of the first distance to the second distance ranges from about 0.6 to about 0.8. In some embodiments, a ratio of the first distance to the second distance is about 0.75.

Such approach would encounter some problems. As shown in FIG. 1, because of structure limitation, the buried power rail 102 staggers with the active region 80p. For the transistor T1, to receive the first supply voltage VDD, the conductive segment 62 is required to be extended longer than the conductive segment 64, and cross over the buried power rail 102. Then, the conductive segment 62 is electrically coupled to the buried power rail 102 through a via VB. In further detail, the conductive segment 62 extends in the Y-direction for a length L1, and the conductive segment 64 extends in the Y-direction for a length L2 shorter than the length L1. However, fabrication of the longer conductive segment 62 may be failed because of unavoidable process variation, as described in detail with reference to the embodiments of FIGS. 3 to 5.

Figure 2B:
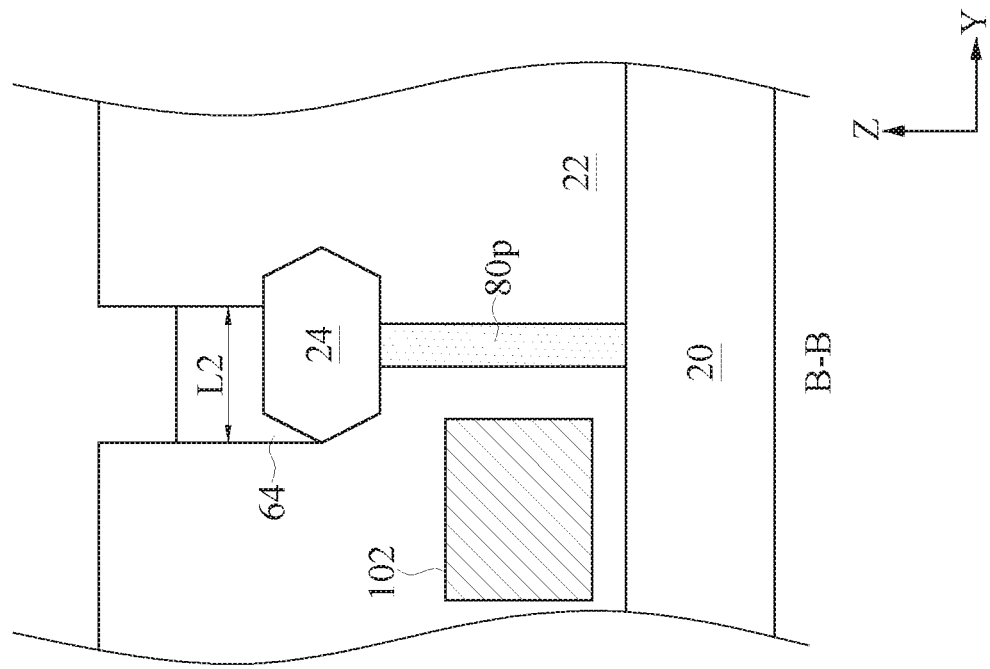
FIG. 2B is a cross-sectional view of the semiconductor device in FIG. 1, in accordance with some embodiments of the present disclosure.
Figure 2A:
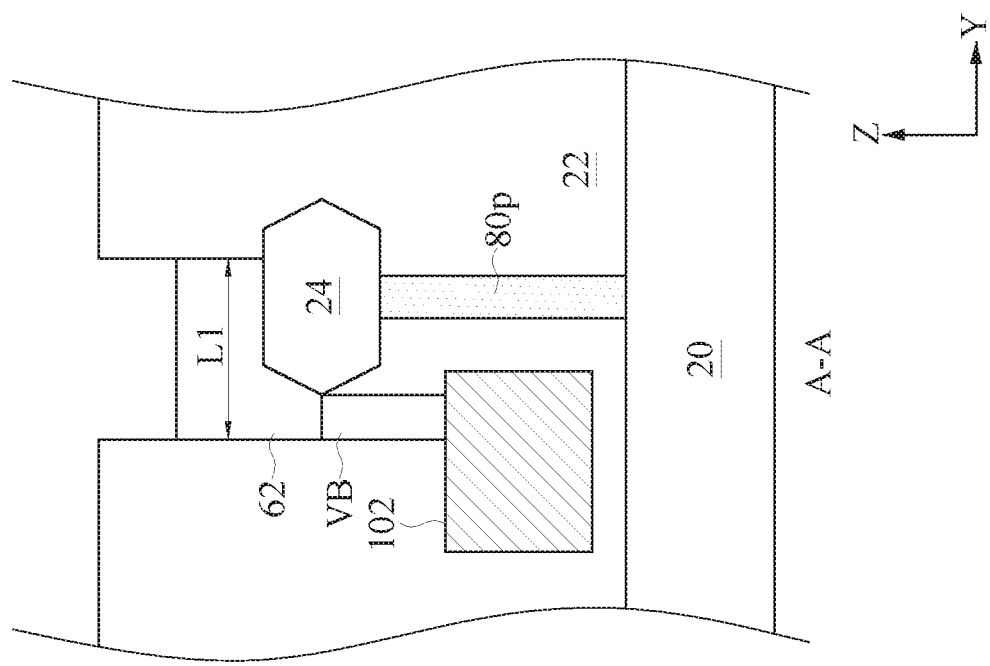
FIG. 2A is a cross-sectional view of the semiconductor device in FIG. 1, in accordance with some embodiments of the present disclosure.

FIG. 2A is a cross-sectional view of the semiconductor device 100 in FIG. 1 along a cutting line A-A, in accordance with some embodiments of the present disclosure.

Referring to FIG. 2A, the buried power rail 102 is in a metal layer, and is disposed above a semiconductor substrate 20 in the Z-direction. Moreover, the buried power rail 102 staggers with the active region 80p disposed on the semiconductor substrate 20 in the Y-direction.

The conductive segment 62 is in a middle layer, such as a middle diffusion layer (MD layer), between the semiconductor substrate 20 and a metal layer M0 (not shown). The conductive segment 62 is electrically coupled to the active region 80p through an epitaxial layer 24.

To couple the buried power rail 102, the conductive segment 62 extends out of the epitaxial layer 24 in the Y-direction. The conductive segment 62 is conductively connected to the buried power rail 102 through the via VB that extends in an inter-layer dielectric (ILD) layer 22. For example, the ILD layer 22 is an ILD0 layer. As such, the buried power rail 102 is connected to the epitaxial layer 24 through the via VB.

FIG. 2B is a cross-sectional view of the semiconductor device 100 in FIG. 1 along a cutting line B-B, in accordance with some embodiments of the present disclosure. Referring to FIG. 2B, the conductive segment 64 is not requested to receive the first supply voltage VDD. As such, there is no need for the conductive segment 64 to extend over the buried power rail 102.

FIG. 3 is a schematic diagram of a top view of the semiconductor device 100 in FIG. 1, only depicting components associated with the conductive segments 62, 64, 66 and 68 shown in FIG. 1, in accordance with some embodiments of the present disclosure. Referring to FIG. 3, a conductive layer including conductive segments 62', 64', 66', and 68' are fabricated over the semiconductor substrate 20. The conductive segment 62' becomes the conductive segments 62 in FIG. 1 after a photolithography process. The conductive segment 64' becomes the conductive segments 64 in FIG. 1 after a photolithography process. The conductive segment 66' becomes the conductive segments 66 in FIG. 1 after a photolithography process. The conductive segment 68' becomes the conductive segments 68 in FIG. 1 after a photolithography process.

Figure 4A:
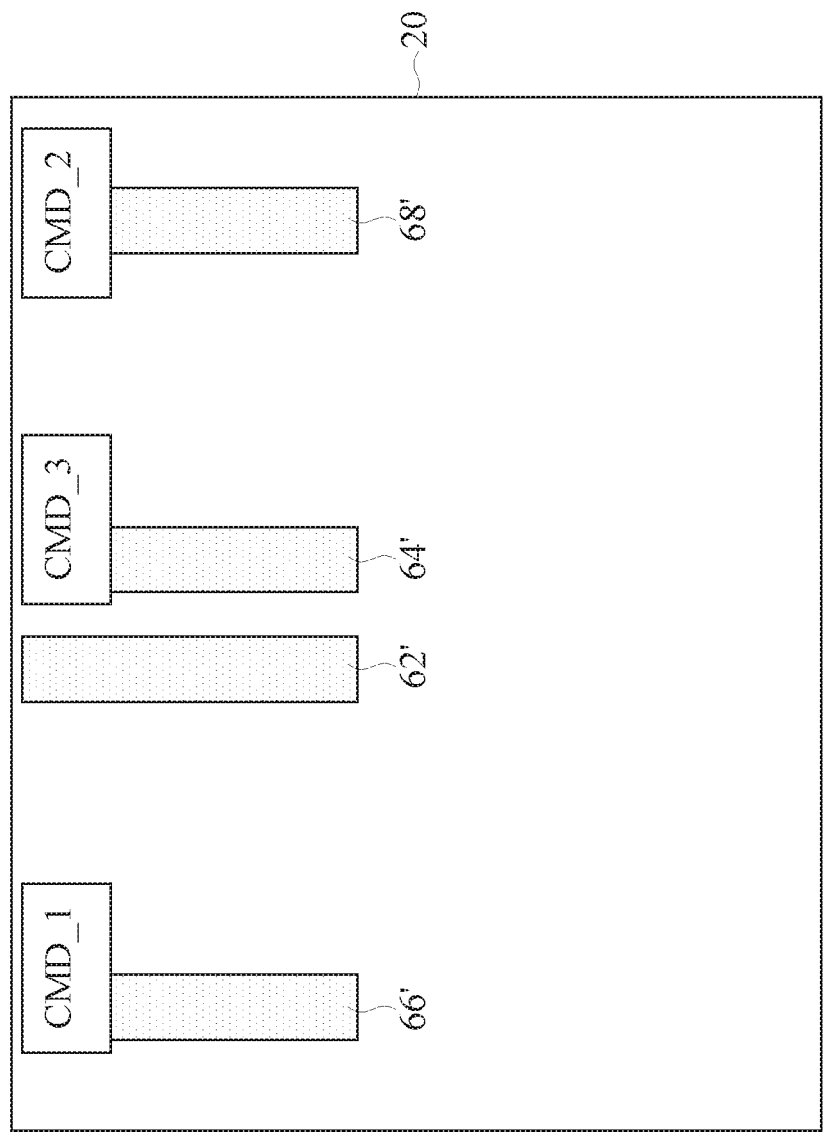
FIG. 4A is a schematic diagram of a top view of the semiconductor device in FIG. 1, illustrating a photolithography process, in accordance with some embodiments of the present disclosure.

FIG. 4A is a schematic diagram of a top view of the semiconductor device 100 in FIG. 1, illustrating a photolithography process, in accordance with some embodiments of the present disclosure. To form the conductive segments 62, 64, 66, and 68 in FIG. 1, a photomask with openings is applied in the photolithography process. For convenience of understanding, the openings are projected onto the semiconductor device 20, and are labeled as CMD_1, CMD_2 and CMD_3. In FIG. 4A, the photomask is aligned with the semiconductor device 100 precisely. The openings CMD_1, CMD_2 and CMD_3 are located at the desired location to arrive at the conductive segments 62, 64, 66, and 68 in FIG. 1.

Figure 4B:
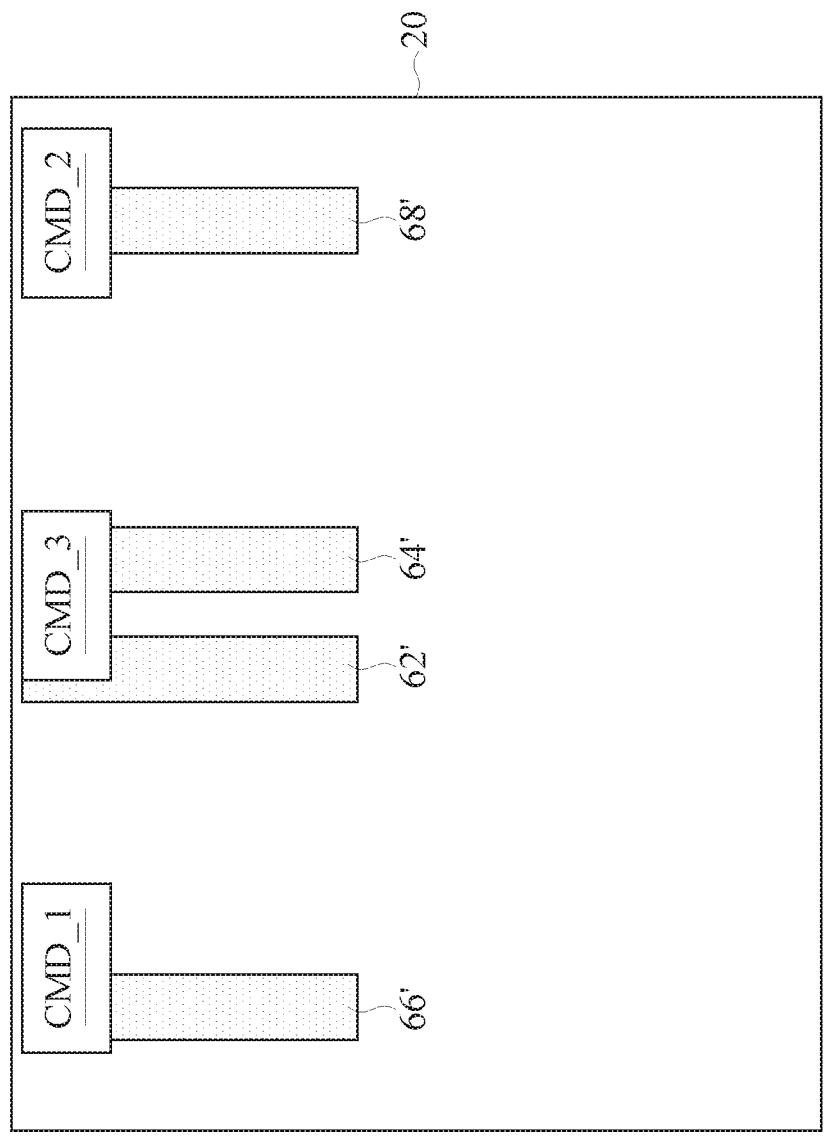
FIG. 4B is a schematic diagram of a top view of the semiconductor device in FIG. 1, illustrating a photolithography process, in accordance with some embodiments of the present disclosure.

FIG. 4B is a schematic diagram of a top view of the semiconductor device 100 in FIG. 1, illustrating a photolithography process, in accordance with some embodiments of the present disclosure. As previously mentioned, to reduce size of the semiconductor device 100, a distance between the conductive segment 62 and the conductive segment 64 is shorter than a distance between the conductive segment 62 and the conductive segment 66. As such, a distance between the conductive segment 62' and the conductive segment 64' is shorter than a distance between the conductive segment 62' and the conductive segment 66'. For illustration, the distance between the conductive segment 62' and the conductive segment 64' is exaggerated. If there is a fabrication variation such that the opening CMD_3 is shifted as shown in FIG. 4B to overlap with the conductive segment 62', the desired conductive segment 62 cannot be arrived at. The transistor T1 may function abnormally.

Figure 5:
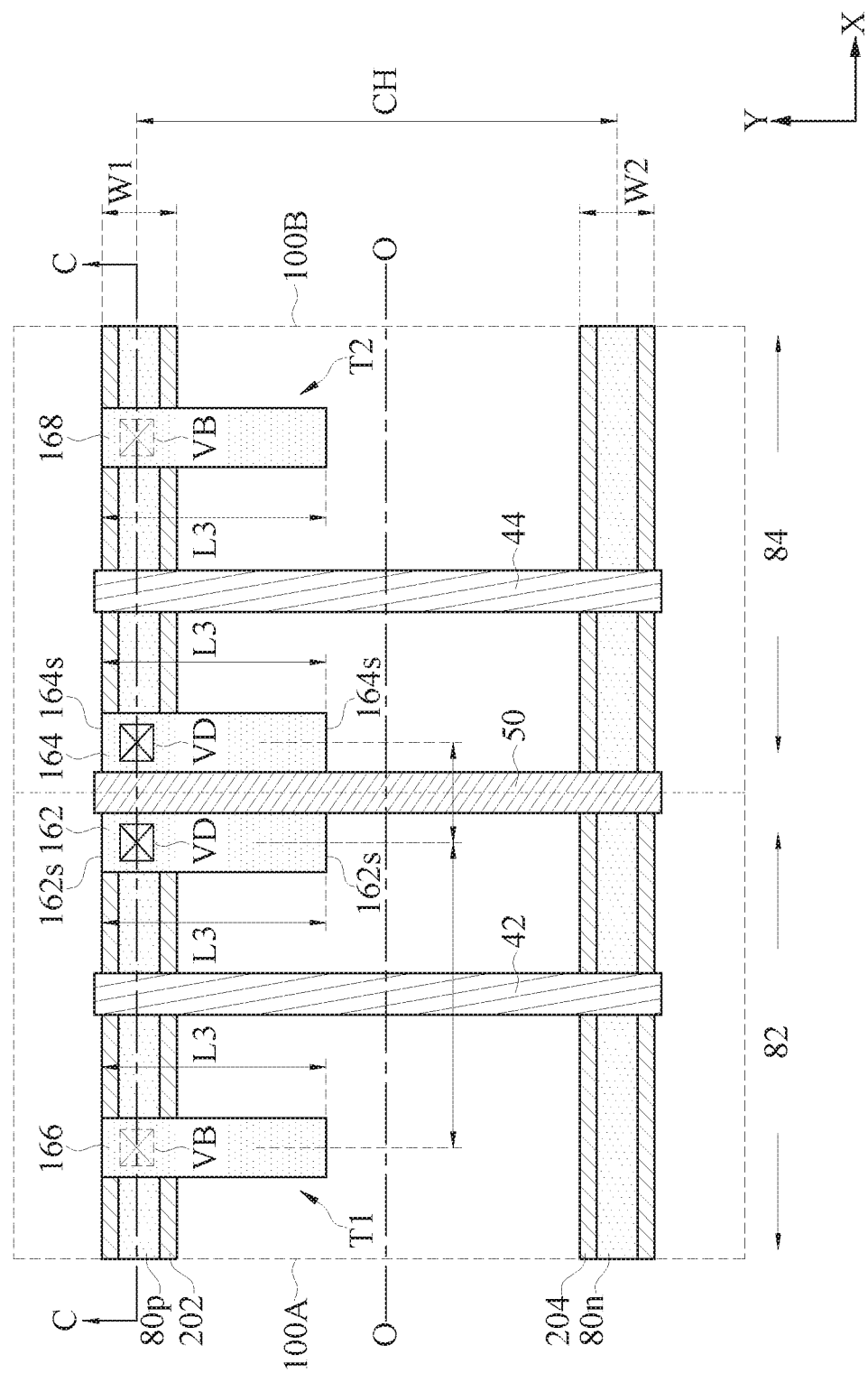
FIG. 5 is a schematic diagram of layout designs for a semiconductor device, in accordance with some embodiments.

FIG. 5 is a schematic diagram of layout designs for a semiconductor device 200, in accordance with some embodiments. Referring to FIG. 5, the layout design for the semiconductor device 200 is similar to that for the semiconductor device 100 illustrated and described with reference to FIG. 1 except that, for example, the layout design for the semiconductor device 200 includes conductive segments 162, 164, 166 and 168 extending in the Y-direction, and power rails 202 and 204 extending in the X-direction.

The conductive segments 162 crosses over the active region 80p, and serves as a conductive line connecting to one of a source region and a drain region of a transistor T1, as illustrated in detail with reference to the embodiments of FIG. 19. The conductive segment 166 crosses over the active region 80p, and serves as a conductive line connecting to the other one of the source region and the drain region of the transistor T1, as illustrated in detail with reference to the embodiments of FIG. 19. In addition, the conductive segment 166 is connected to the power rail 202 through a via VB, as described and illustrated in detail with reference to FIG. 18.

The conductive segments 164 crosses over the active region 80p, and serves as a conductive line connecting to one of a source region and a drain region of a transistor T2, as illustrated in detail with reference to the embodiments of FIG. 19. The conductive segments 168 crosses over the active region 80p, and serves as a conductive line connecting to the other one of the source region and the drain region of the transistor T2, as illustrated in detail with reference to the embodiments of FIG. 19. In addition, the conductive segment 168 is connected to the power rail 202 through the via VB, as described and illustrated in detail with reference to FIG. 18.

In some embodiments, the semiconductor device 200 further includes multiple conductive segments symmetrical to the conductive segments 166, 162, 164 and 168 with respect to a center line O-O of the semiconductor device 200. In the present embodiment, the transistors T1 and T2 at one side of the center line O-O are p-type transistors, and other transistors defined by the multiple conductive segments at the other side of the center line O-O are n-type transistors.

In some embodiments, fin structures in the X-direction are fabricated in the active region 80p, and the gates for FinFETs are formed above the channel regions with the gate-strips crossing over the fin structures. In some embodiments, the gates for other type of FETSs are formed above the channel regions when the gate-strips cross over the active region 80p.

In some embodiments, the transistors T1 and T2 includes a Nano-sheet structure, or a Nano-wire structure. In some embodiments, a Nano-wire structure includes a gate all around structure.

The spacer 50 divides the active region 80p into a first part 82 and a second part 84. The first part 82 and the second part 84 of the active region 80p are conductively isolated from each other by the spacer 50. That is, the cell 100A and the cell 100B are separated by the spacer 50.

In some embodiments, the active region 80p is associated with the form of a CNOD region which does not break at the boundary between two abutting cells for constructing a functional circuit.

In addition, the spacer 50 physically joins the conductive segment 162 and the conductive segment 164 while preventing conductive contact between the conductive segment 162 and the conductive segment 164.

A join length between the conductive segment 162 and the spacer 50 is equal to a join length between the conductive segment 164 and the spacer 50. In other words, the conductive segment 162 extends in the Y-direction for a length L3, and the conductive segment 164 extends in the Y-direction for the length L3. The extension length L3 can be deemed as the join length. In some embodiments, both conductive segments 162 and 164 have a square shape. A short side 162s of the conductive segment 162 is leveled with a short side 164s of the conductive segment 164 in the Y-direction.

Since the conductive segments 162 and 164 joined by the spacer 50 has the same length L3, the issue described in the embodiment of FIG. 4 is addressed. There is no worry about unintended destroy to any of the conductive segments 162 and 164 joined by the spacer 50.

In addition to the conductive segments 162 and 164, both the conductive segments 166 and 168 extend in the Y-direction for the length L3. In some embodiments, each of conductive segments in the semiconductor device 200 has a uniform length L3 in the Y-direction. In some embodiments, each of conductive segments (e.q., 162, 164, 166 and 168) have a square shape. In this case, a short side of each of the conductive segments is leveled with each other in the Y-direction.

The power rails 202 and 204 respectively provide a first voltage VDD and a second supply voltage VSS. In some embodiments, the buried power rails power rails 202 and 204 are a backside power rail, as described in detail with reference to FIGS. 6 to 18. For convenience of discussion, the power rail 202 is taken as an exemplary example in the following description.

The power rail 202 extends in the X-direction, and covered by the active region 80p. In addition, the power rail 202 is crossed over by the conductive segments 162, 164, 166 and 168. As such, the conductive segments 162, 164, 166 and 168 are electrically connected to the power rail 202, if required.

In some embodiments, the power rail 202 has a width W1 in the Y-direction. The power rail 204 has a width W2 in the Y-direction. In some embodiments, the width W1 is equal to the width W2. In some embodiments, the width W1 is different from the width W2. In addition, a distance in the Y-direction between a middle line of the power rail 202 and a middle line of the power rail 204 defines a measurement unit that is labeled as CH ("Cell Height"). In some embodiments, the width W1 ranges from about 0.3CH to about 0.5CH. In some embodiments, the width W2 ranges from about 0.3CH to about 0.5CH.

The gate-strip 42 in the cell 100A crosses over the two parallel active regions (e.g., 80p and 80n) at a first side of the spacer 50, and the gate-strip 44 in the cell 100B crosses over the two parallel active regions (e.g., 80p and 80n) at a second side of the spacer 50.

FIGS. 6 to 18 are cross-sectional views of devices fabricated based on a layout design shown in FIG. 5 taken along a cutting line C-C, in accordance with some embodiments.

Figure 6:
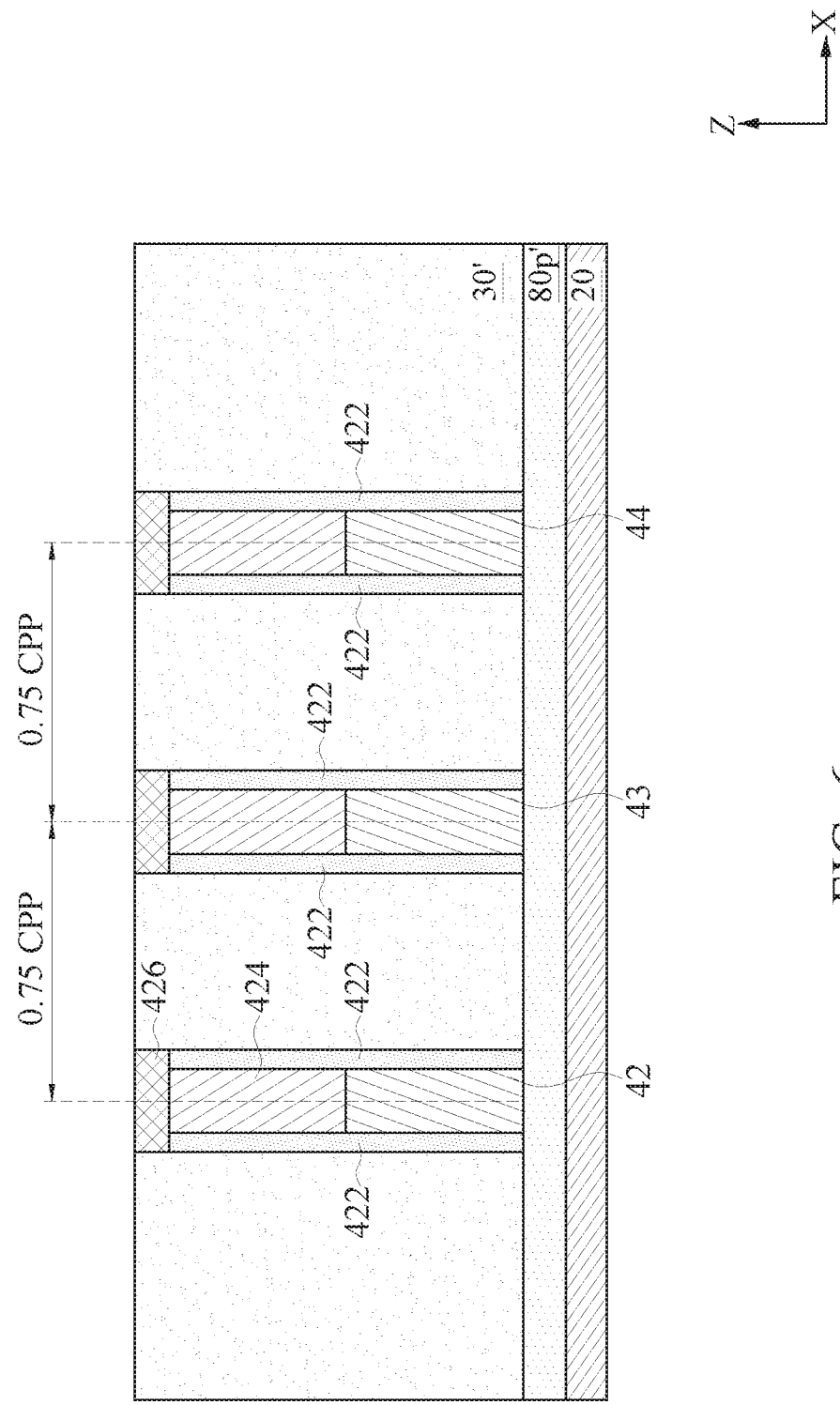
FIGS. 6 to 18 are cross-sectional views of devices fabricated based on a layout design shown in FIG. 5, in accordance with some embodiments.

Referring to FIG. 6, a semiconductor substrate 20 is received or provided. An active region 80p' is formed on the semiconductor substrate 20. In some embodiments, the active region 80p' includes a fin structure. In some embodiments, the active region 80p' is fabricated in the form of a CNOD active region.

Gate-strips 42, 43 and 44 are formed on the active region 80p', and formed in an inter-layer dielectric (ILD) layer 30'. In some embodiments, the ILD layer 30' includes an ILD0 layer. Generally, a distance between a middle line of a gate-strip and a middle line of another gate-strip defines a measurement unit that is labeled as CPP ("Contacted Poly Pitch"). However, the gate-strip 43 is removed in the subsequent operation, and the location where the gate-strip 43 is located is provided for forming a spacer 50. As such, the distance between the gate-strip 43 and the gate-strip 42 is not equal to one CPP, and is 1.5CPP. Similarly, the distance between the gate-strip 44 and the gate-strip 42 is not equal to one CPP, and is 1.5CPP.

Gate spacers 422 are fabricated on both sides of each gate-strip (e.g., 42, 43, or 44). The tops of the gate-strips are covered with an insulation portion 424 for making self-aligned contacts. The insulation portion 424 serves as a sacrifice portion in the subsequent operation. Gate spacers 422 and the insulation portion 424 are covered by a cap portion 426. In some embodiments, the cap portion 426 includes an insulation portion.

Figure 7:
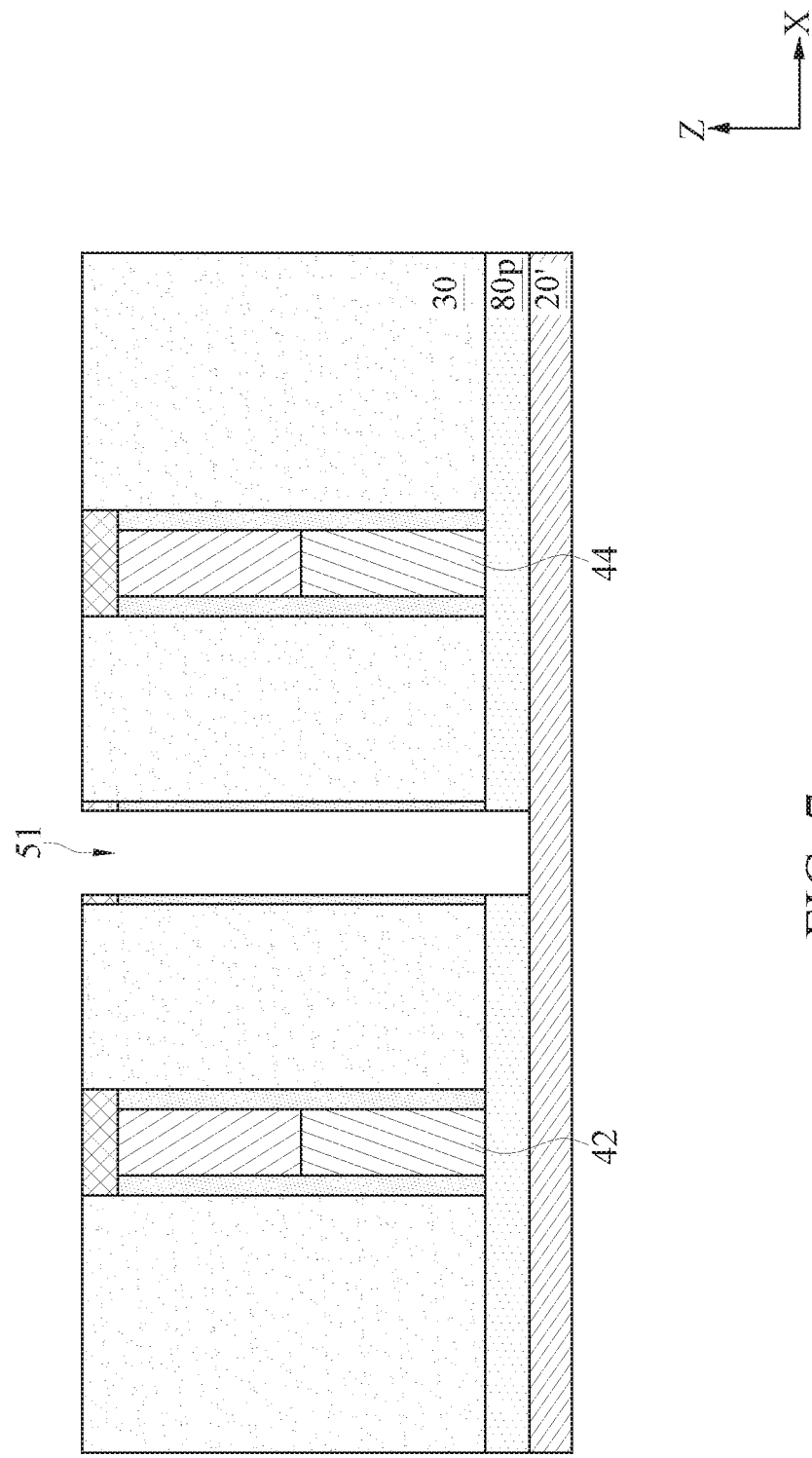

Referring to FIG. 7, an opening trench 51, a semiconductor substrate 20', an active region 80p, and an ILD layer 30 are formed by patterning semiconductor substrate 20, the active region 80p' and the ILD layer 30' in FIG. 6. The opening trench 51 exposes portions of the semiconductor substrate 20'. In some embodiments, the spacers 422 on both sides of the gate-strip 43 may not be completely removed. In some embodiments, the cap portion 426 over the gate-strip 43 may not be completely removed.

Figure 8:
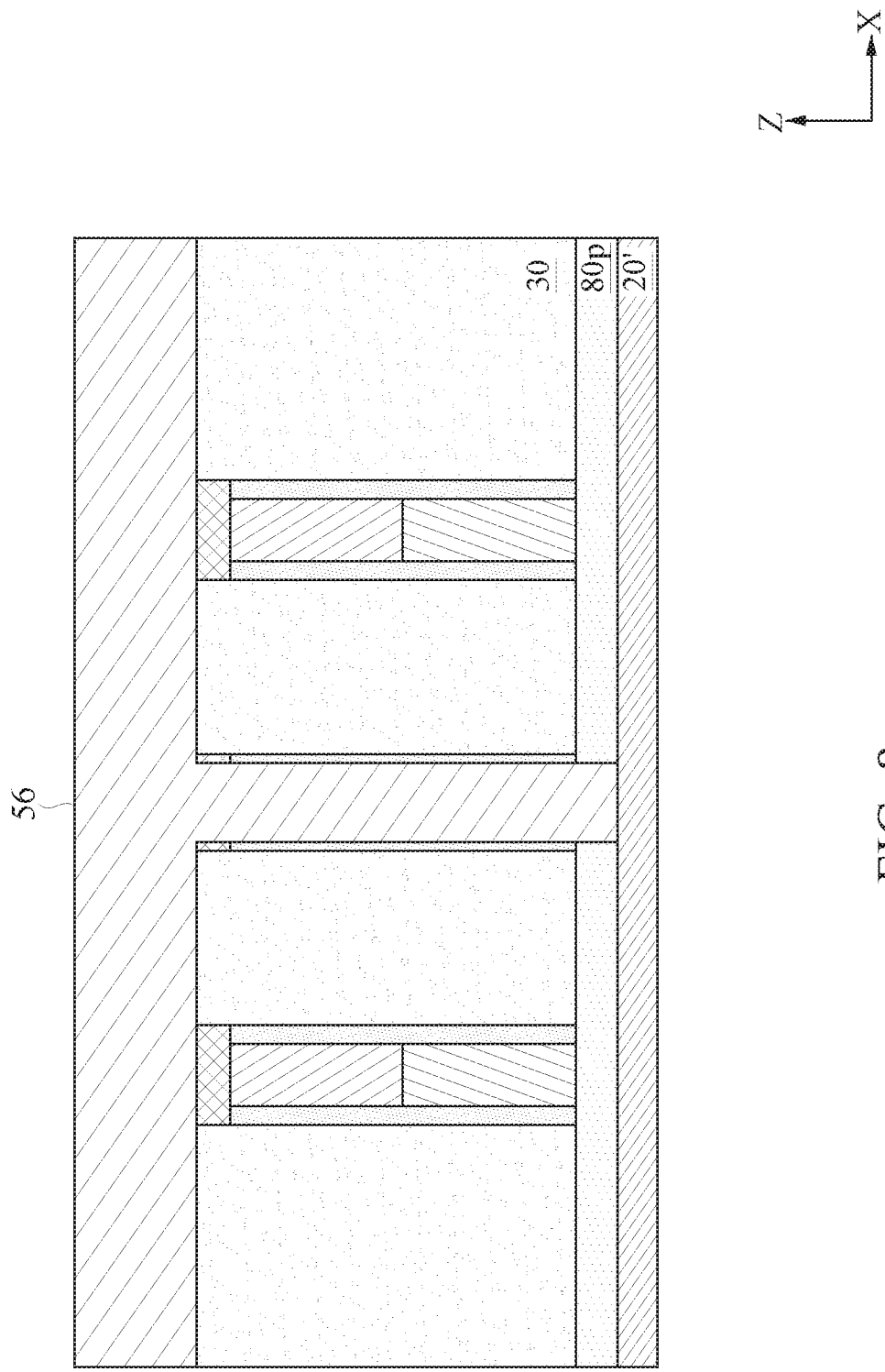

Referring to FIG. 8, the opening trench 51 is filled with an insulation material 56 (e.g., silicon nitride Si3N4). Moreover, the insulation material 56 is disposed on the ILD layer 30 and the exposed portion of the semiconductor substrate 20'.

Figure 9:
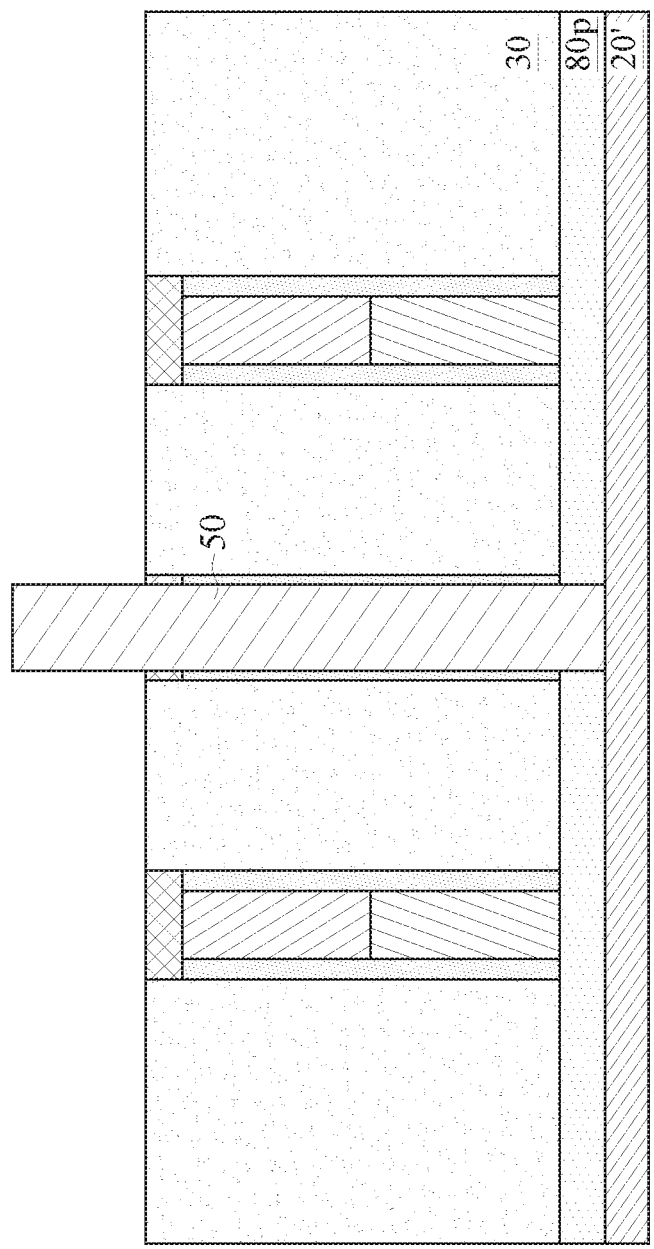

Referring to FIG. 9, a spacer 50 is formed by removing excess insulation material 56 (e.g., silicon nitride Si3N4). The spacer 50 protrudes into the semiconductor substrate 20' and divides the active region 80p into two parts that are conductively isolated from each other by the spacer 50.

Figure 10:
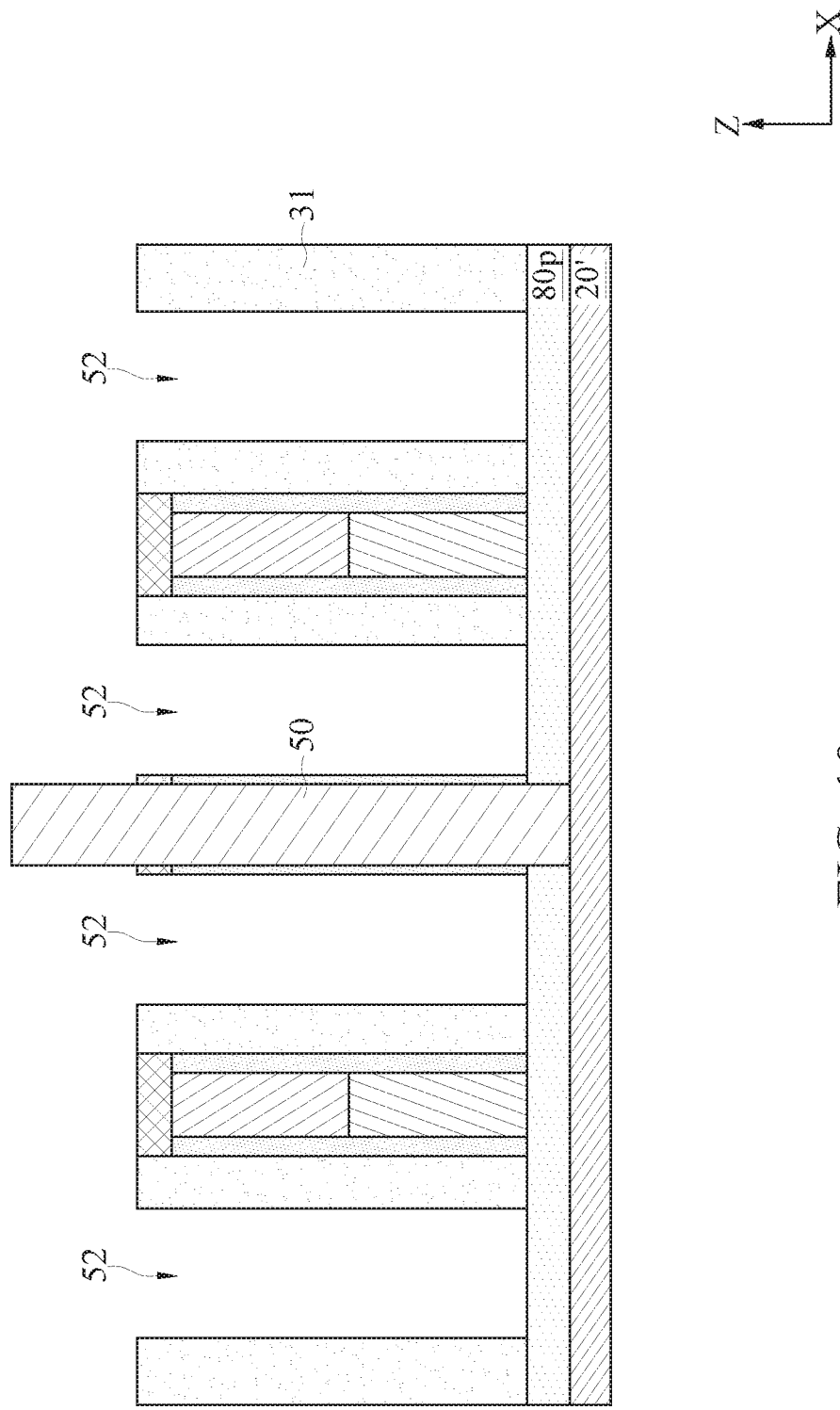

Referring to FIG. 10, an ILD layer 31 is formed by patterning the ILD layer 30, exposing portions of the active regions 80p through openings 52.

Figure 11:
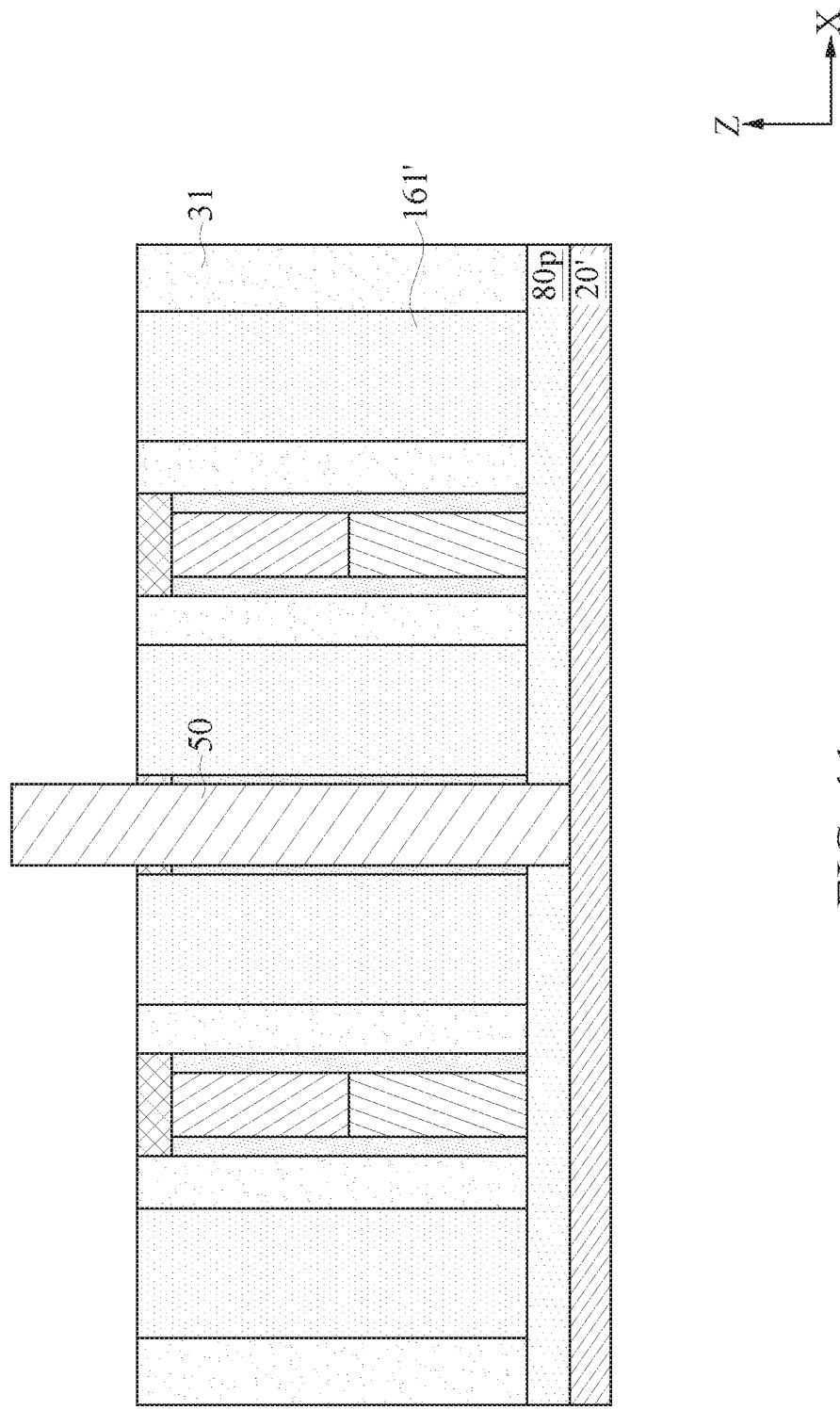

Referring to FIG. 11, an intermediate layer 161' is formed in the ILD layer 31 by disposing conductive materials into the openings 52 shown in FIG. 10. In some embodiments, the intermediate layer 161' includes a MD layer.

Figure 12:
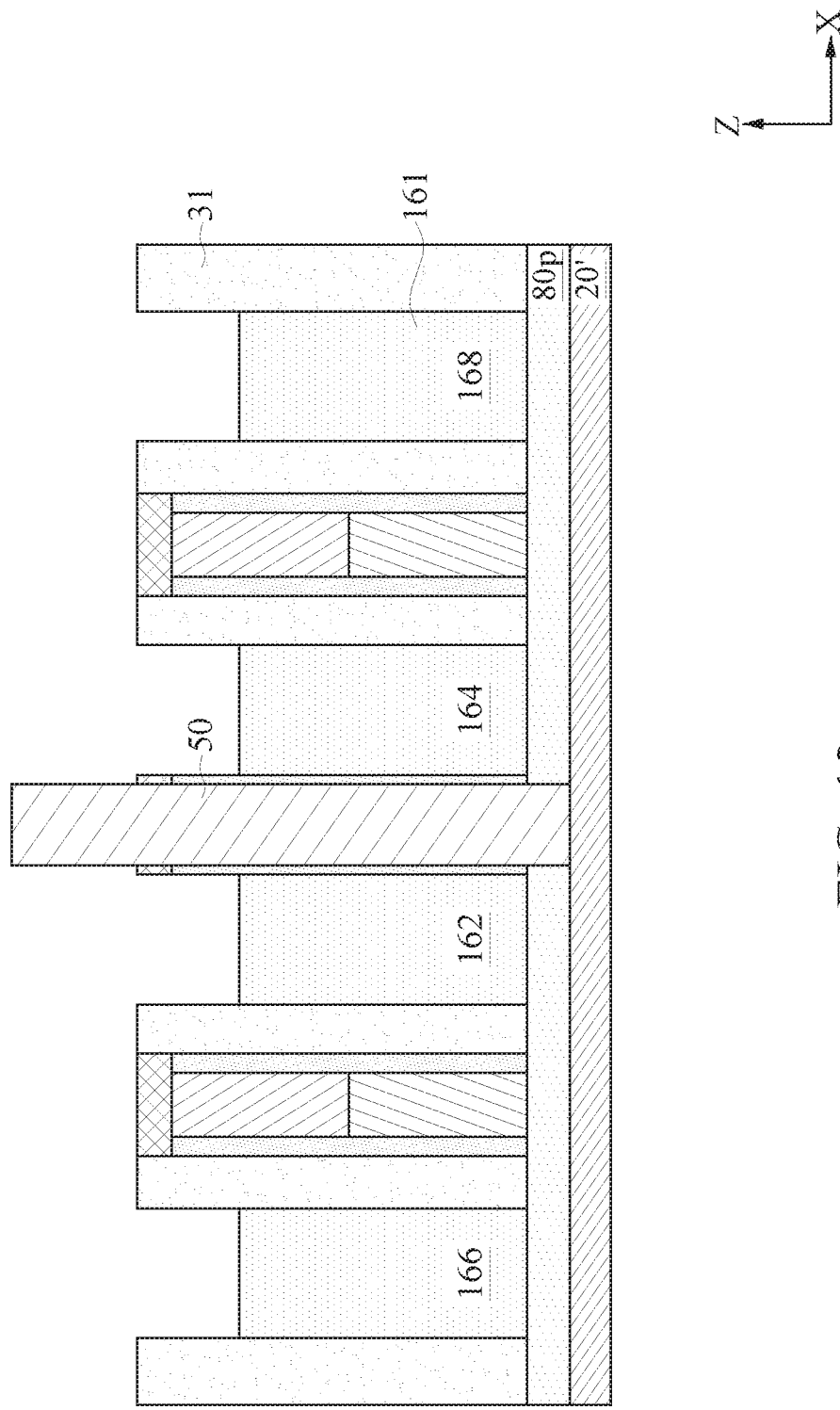

Referring to FIG. 12, an intermediate layer 161 is formed in the ILD layer 31 by removing a top portion of the intermediate layer 161' shown in FIG. 11. The intermediate layer 161 includes conductive segments 162, 164, 166 and 168. In other words, the conductive segments 162, 164, 166 and 168 are in the intermediate layer 161. The conductive segments 162, 164, 166 and 168 cross over the active zone 80 and form conductive contacts with the active region 80p. In some embodiments, the exposed top surface of each of the conductive segments 162, 164, 166 and 168 are leveled with each other in the Z-direction.

Figure 13:
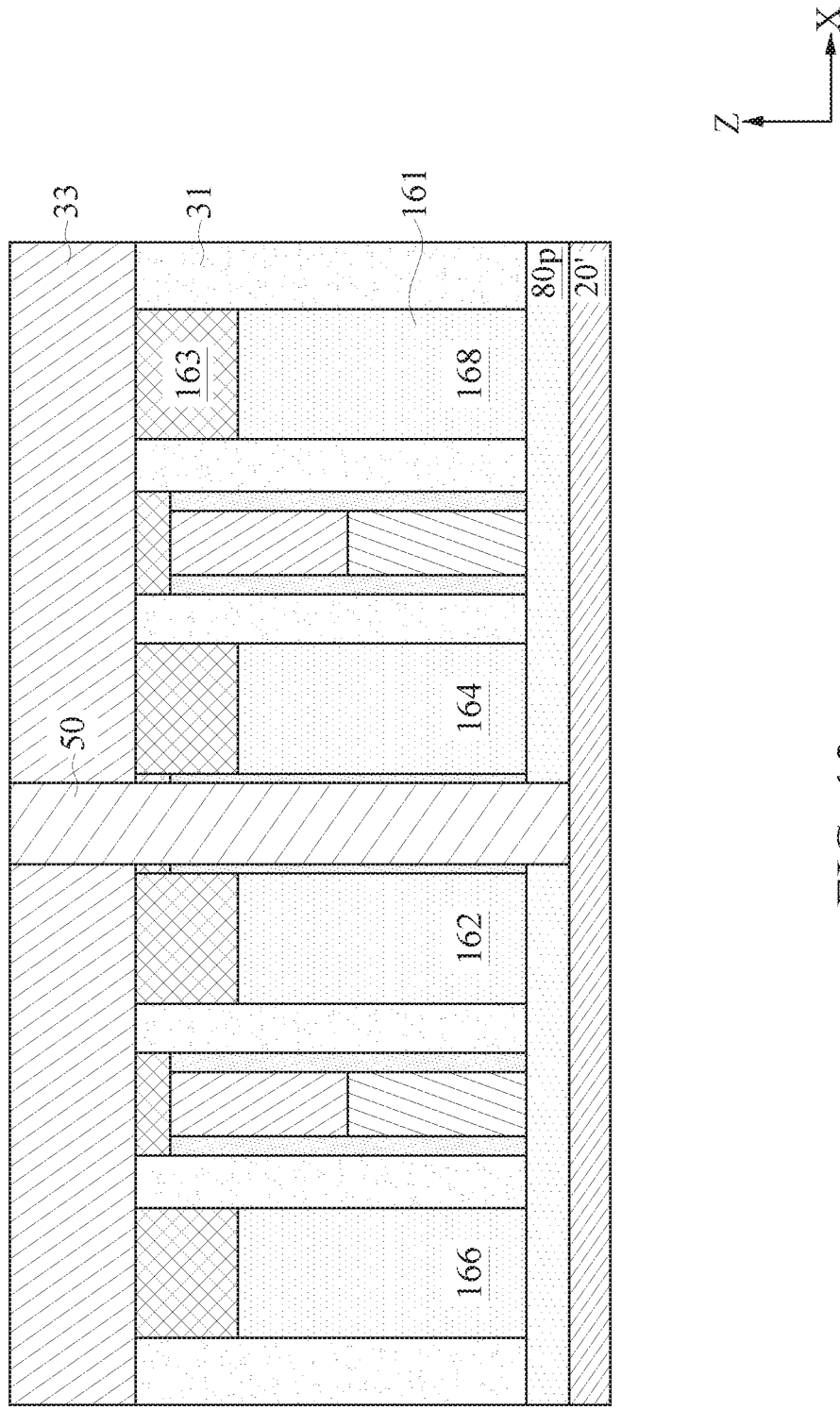

Referring to FIG. 13, an insulation layer 163 is formed on the intermediate layer 161 by, for example, a deposition process and a chemical mechanical planarization (CMP). In some embodiments, the insulation layer 163 is used for making self-aligned contacts. In further detail, the insulation layer 163 covers the exposed top surface of each of the conductive segments 162, 164, 166 and 168. Then, an ILD layer 33 is formed on the insulation layer 163 and the ILD layer 31. In some embodiments, the ILD layer 33 includes an ILD1 layer.

Figure 14:
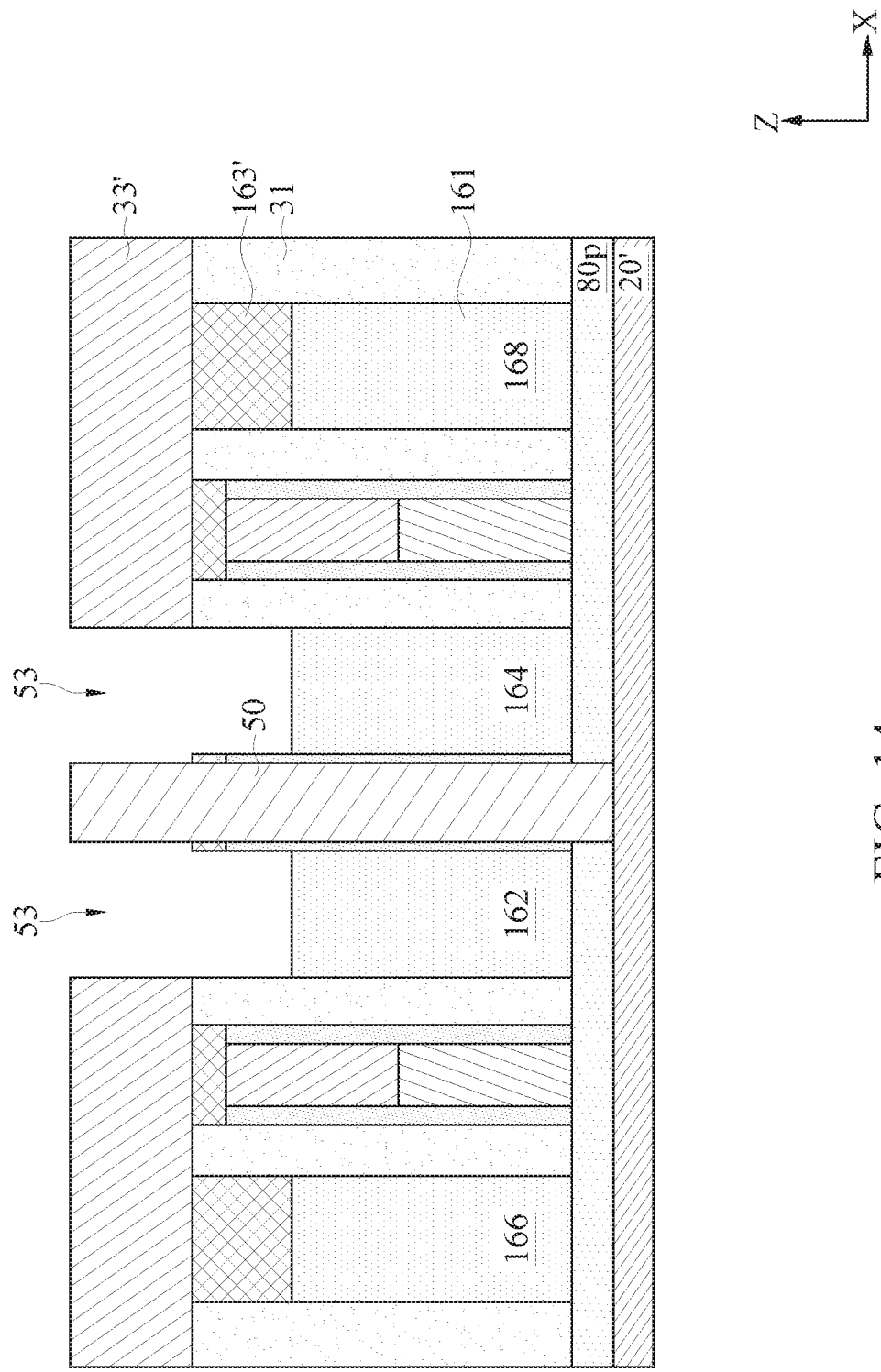

Referring to FIG. 14, an insulation layer 163' and an ILD layer 33' are formed by patterning the insulation layer 163 and the ILD layer 33, exposing the top surface of the conductive segments 162 and 164 through openings 53.

Figure 15:
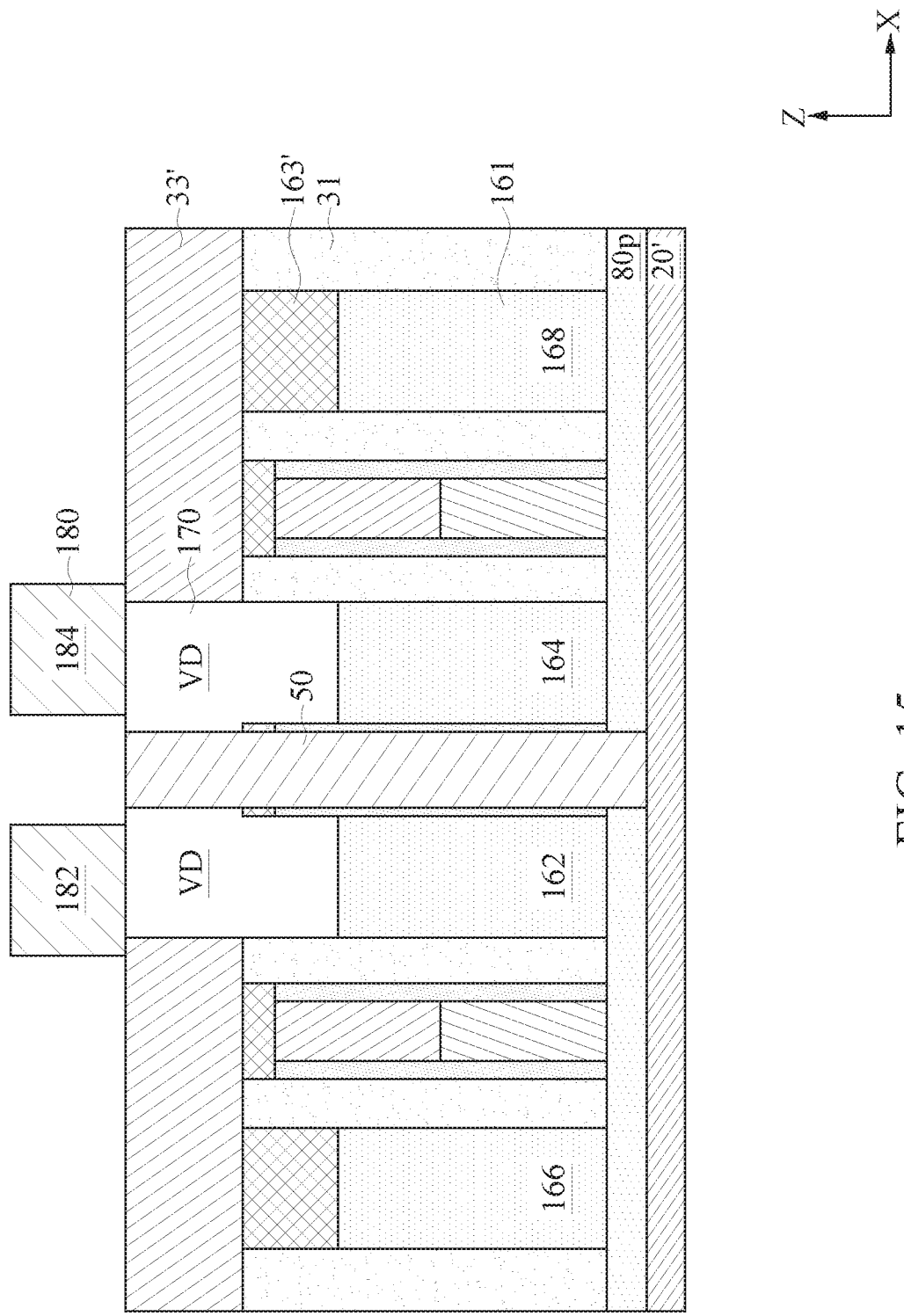

Referring to FIG. 15, a via layer 170 is formed on the intermediate layer 161 by disposing conductive materials into the openings 53 and onto the exposed surface of each of the conductive segments 162 and 164. The via layer 170 includes vias VD for connecting to the conductive segments 62 and 64.

Then, a metal layer 180 is formed on the via layer 170 and ILD layer 33'. In some embodiments, the metal layer 180 includes a metal layer M0. For brevity, the metal layer 180 is not shown in the layout design shown in FIG. 5. The metal layer 180 includes conductive routing lines 182 and 184. The conductive routing line 182 is conductively connected to the conductive segment 162 through the via VD. The conductive routing line 184 is conductively connected to the conductive segment 164 through the via VD.

Figure 16:
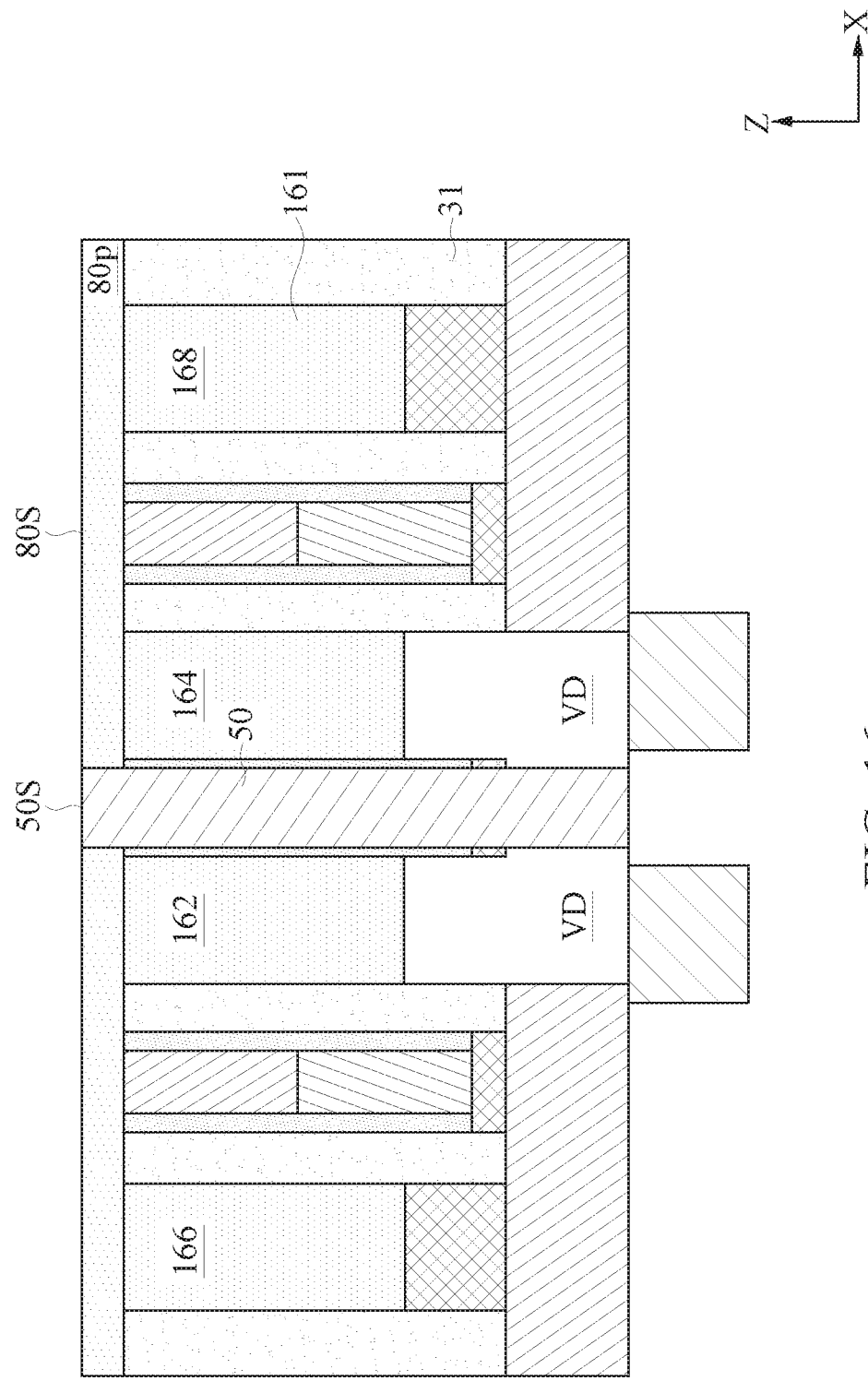

Referring to FIG. 16, the structure shown in FIG. 15 is flipped in the Z-direction. Then, the semiconductor substrate 20' is removed by a wafer thinning process, exposing the active region 80p. In some embodiments, when the wafer thinning process is performed, the spacer 50 is thinned simultaneously. In this case, a surface 50S of the spacer 50 is leveled with a surface 80s of the active region 80p.

Figure 17:
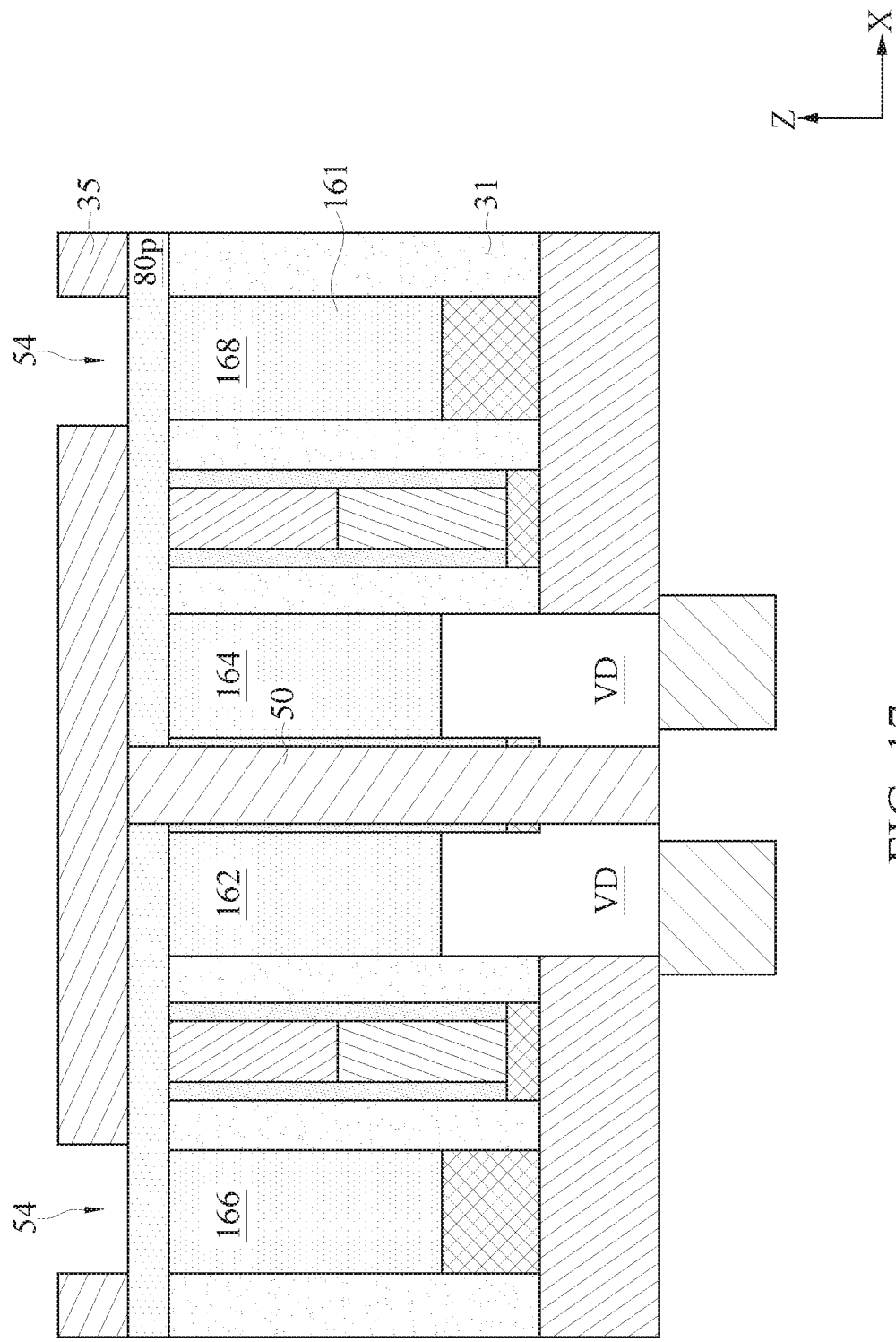

Referring to FIG. 17, a patterned dielectric layer 35 is formed on the active region 80p, exposing a portion of the active region 80p through openings 54.

Figure 18:
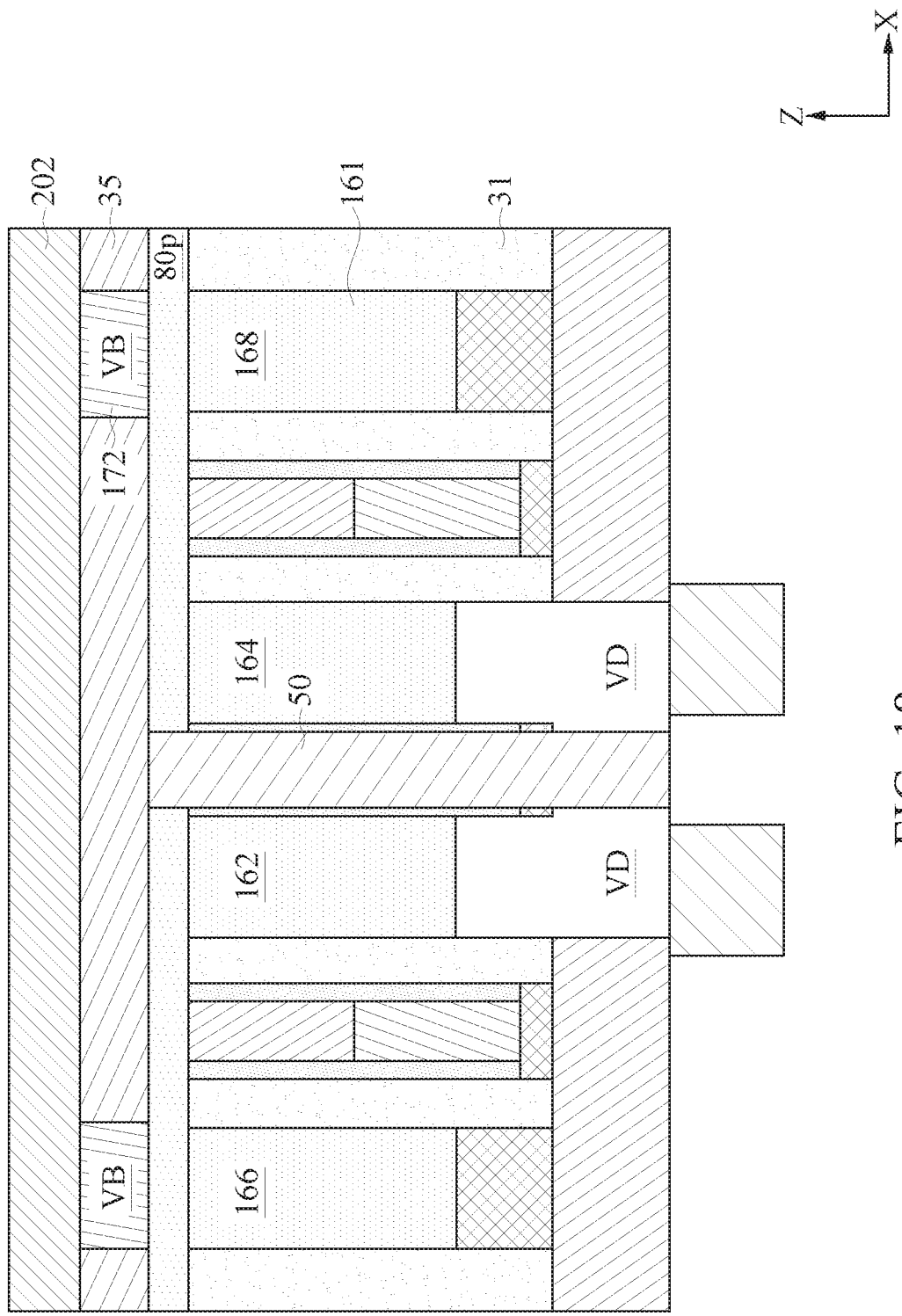

Referring to FIG. 18, a via layer 172 is formed in the patterned dielectric layer 35 by disposing conductive materials into the openings 54 and onto the exposed surface of the active region 80p.

Then, a metal layer 202 is formed on the patterned dielectric layer 35 and the via layer 172. The metal layer 202 serves as the power rail 202 shown in FIG. 5. The metal layer 202 is conductively connected to the conductive segment 166 through a via in the via layer 172. The metal layer 202 is conductively connected to the conductive segment 168 through another via in the via layer 172.

If it is desired to conductively connect either the conductive segment 162 or the conductive segment 164 to the power rail 202, then in operation shown in the embodiment of FIG. 17, the opening 54 is formed over the corresponding conductive segment.

Figure 19:
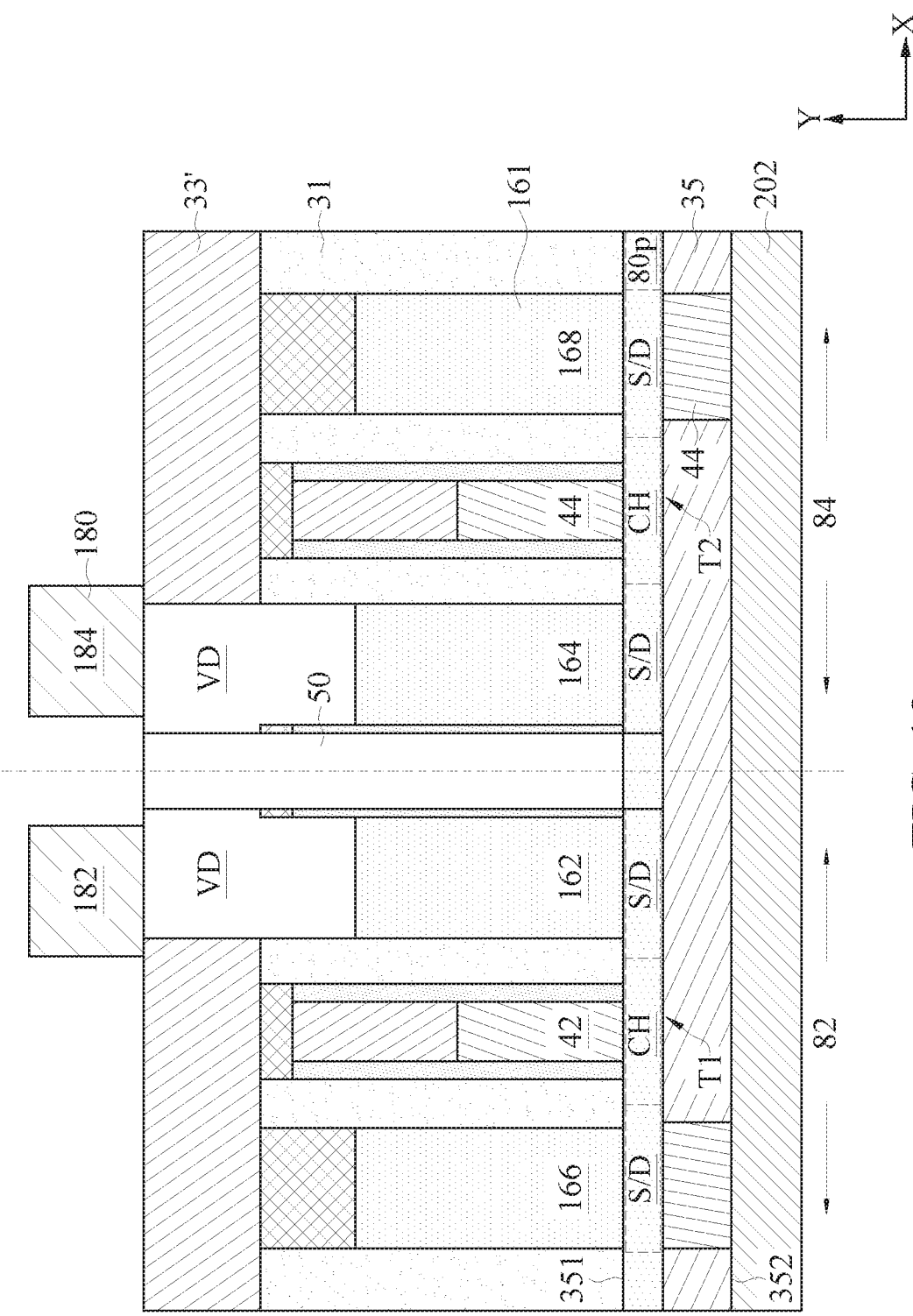
FIG. 19 is cross-sectional view of a semiconductor device fabricated based on a layout design shown in FIG. 5 and process flow shown in FIGS. 6 to 18.

FIG. 19 is cross-sectional view of a semiconductor device 200 fabricated based on a layout design shown in FIG. 5 and process flow shown in FIGS. 6 to 18. Referring to FIG. 19, a patterned dielectric layer 35 has a first surface 351 and a second surface 352 opposite to the first surface 351. An active region 80p is disposed on the first surface 351 of the patterned dielectric layer 35. A power rail 202 is disposed under the second surface 352 of the patterned dielectric layer 35, and overlaps with the active region 80p. That is, the patterned dielectric layer 35 is between the active region 80p and the power rail 202.

A spacer 50 is disposed on the first surface 351 of the patterned dielectric layer 35, and physically divides the active region 80p into a first part 82 and a second part 84. The first part 82 and the second part 84 is conductively isolated from each other by the spacer 50. In addition, the spacer 50 joins the conductive segment 162 and the conductive segment 164, and electrically isolates the conductive segment 162 from the conductive segment 164.

The conductive segments 162 and 164 are in an intermediate layer 161. The intermediate layer 161 is disposed on the active region 80p, and in contact with the active region 80p. A portion of the active region 80p in contact with the conductive segment (e.q., 162, 164, 166, or 168) serves as a one of a source region and a drain region (labeled "S/D").

The gate-strips 42 and 44 are disposed on the active region 80p, and in contact with the active region 80p. A portion of the active region 80p in contact with the gate-strip (e.q., 42 or 44) serves as a channel region (labeled "CH").

As shown in FIG. 19, the active region 80p is between the intermediate layer and 161 the patterned dielectric layer 35. The intermediate layer 161 is between a metal layer 180 and the active region 80p. In addition, the intermediate layer 161 is in an ILD layer 31 on the first surface 351 of the patterned dielectric layer 35. The metal layer 180 extends above the ILD layer 31 and the intermediate layer 161.

Figure 20:
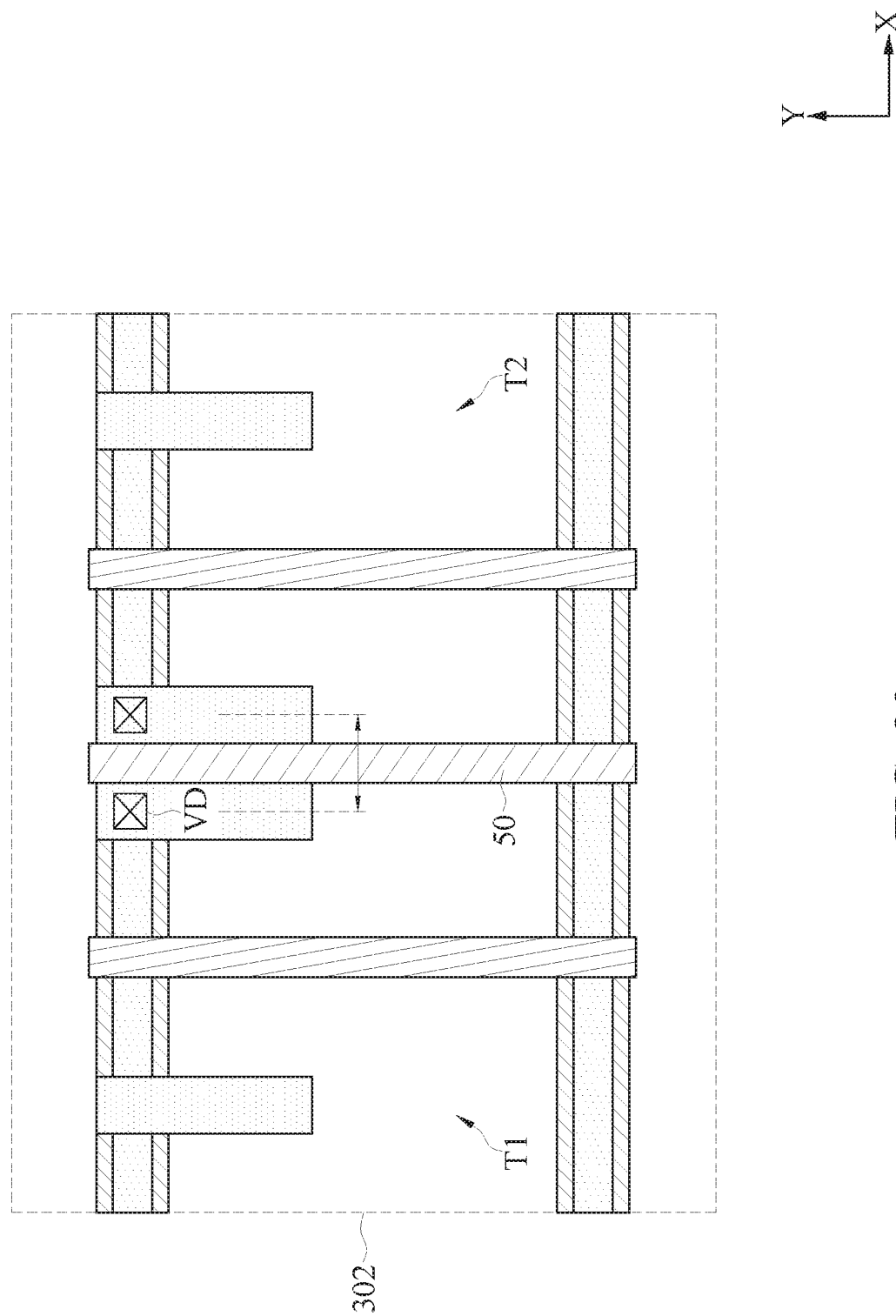
FIG. 20 is a schematic diagram of layout designs for a semiconductor device, in accordance with some embodiments.

FIG. 20 is a schematic diagram of layout designs for a semiconductor device 300, in accordance with some embodiments. Referring to FIG. 20, the layout design for the semiconductor device 300 is similar to that for the semiconductor device 200 described and illustrated with reference to FIG. 5 except that, for example, the semiconductor device 300 includes a cell 302 including transistors T1 and T2. In further detail, a spacer 50 is inside in the cell 302, instead of being located at a vertical boundary between two cells like cells 100A and 100B in FIG. 5.

Figure 21:
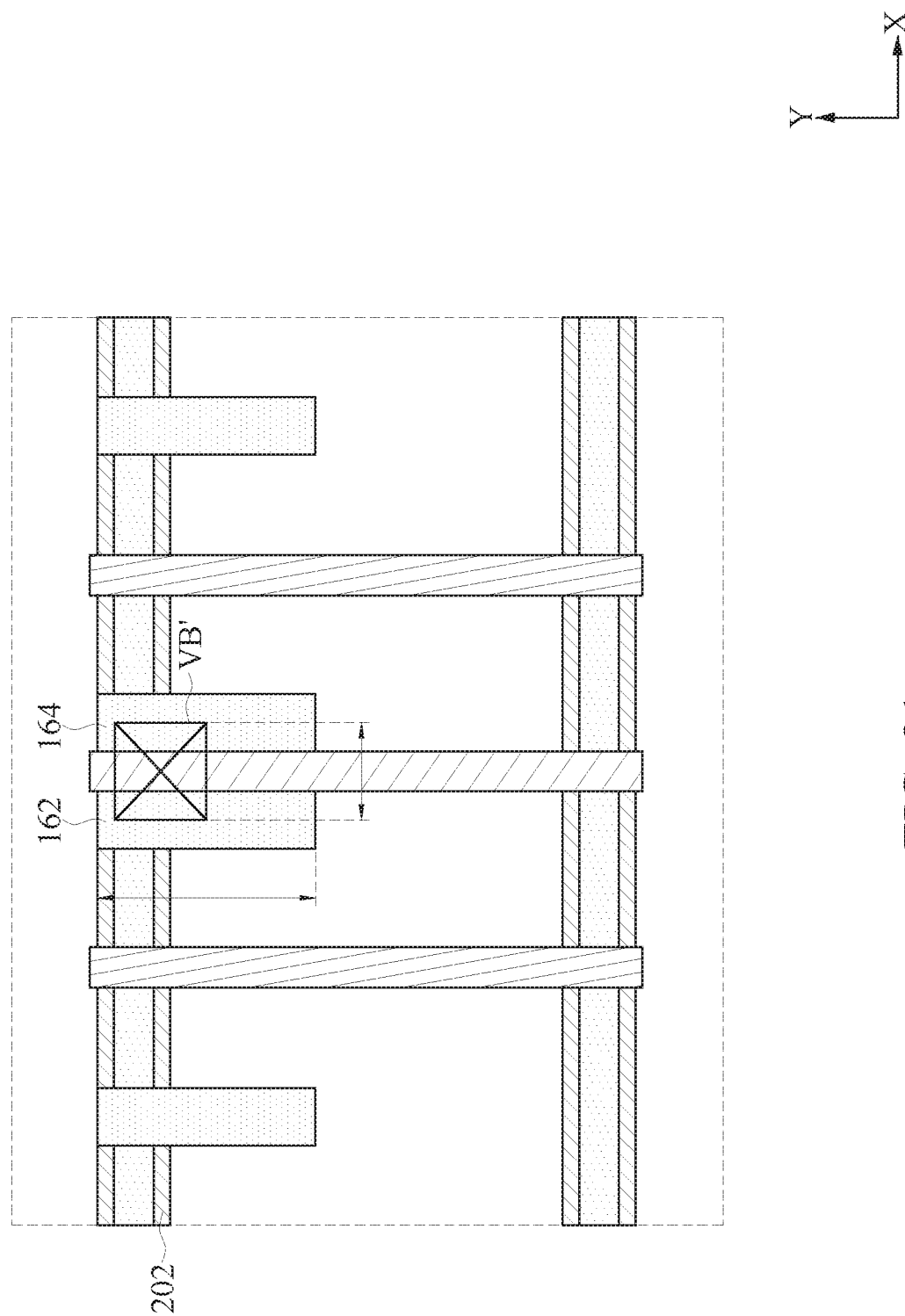
FIG. 21 is a schematic diagram of layout designs for a semiconductor device, in accordance with some embodiments.

FIG. 21 is a schematic diagram of layout designs for a semiconductor device 400, in accordance with some embodiments. Referring to FIG. 21, the layout design for the semiconductor device 400 is similar to that for the semiconductor device 300 described and illustrated with reference to FIG. 5 except that, for example, the conductive segments 162 and 164 are coupled to the power rail 202. Generally, to couple to the power rail 202, each of the conductive segments 162 and 164 is equipped with one via VB like the via VB shown in FIG. 5. In that case, there are two vias VB. In the embodiment of FIG. 21, the two vias VB are merged as a common via VB', as shown in FIG. 21. Conductive segments 162 and 164 joined by a spacer 50 shared the common via VB'. Size of the common via VB' is bigger than that of the via VB shown in FIG. 5.

Figure 22:
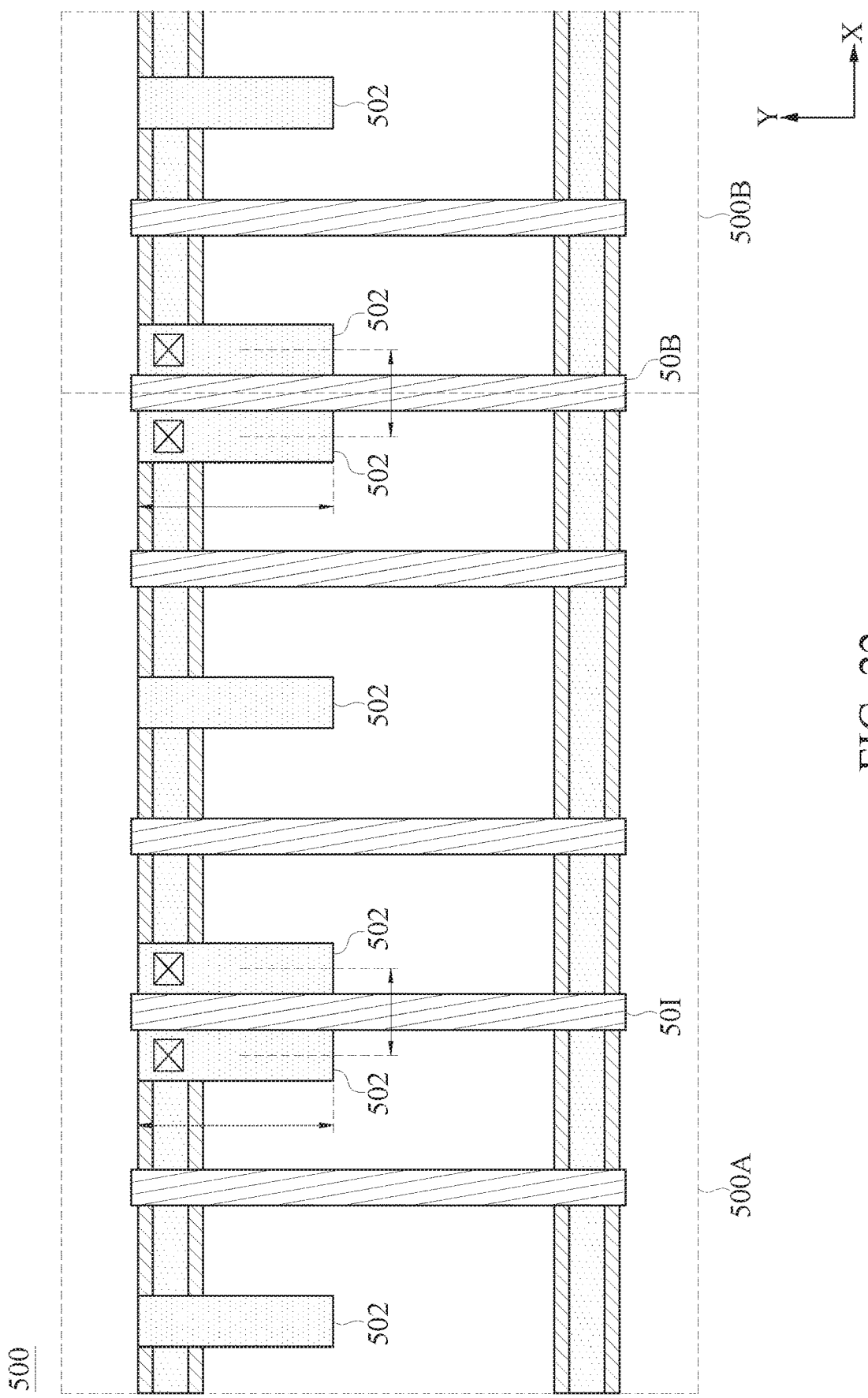
FIG. 22 is a schematic diagram of layout designs for a semiconductor device, in accordance with some embodiments.

FIG. 22 is a schematic diagram of layout designs for a semiconductor device 500, in accordance with some embodiments. Referring to FIG. 22, the layout design for the semiconductor device 500 is similar to that for the semiconductor device 200 described and illustrated with reference to FIG. 5 except that, for example, the semiconductor device 500 includes two spacers 50A and 50B. The spacer 50A is located inside a cell 500A of the semiconductor device 500, and the spacer 50B is located at a vertical boundary between the cells 500A and 500B.

In some embodiments, each of conductive segments 502 including conductive segments joined by a spacer (e.q., 500A and 500B) or conductive segments not joined by a spacer has a uniform length in the Y-direction.

Figure 23:
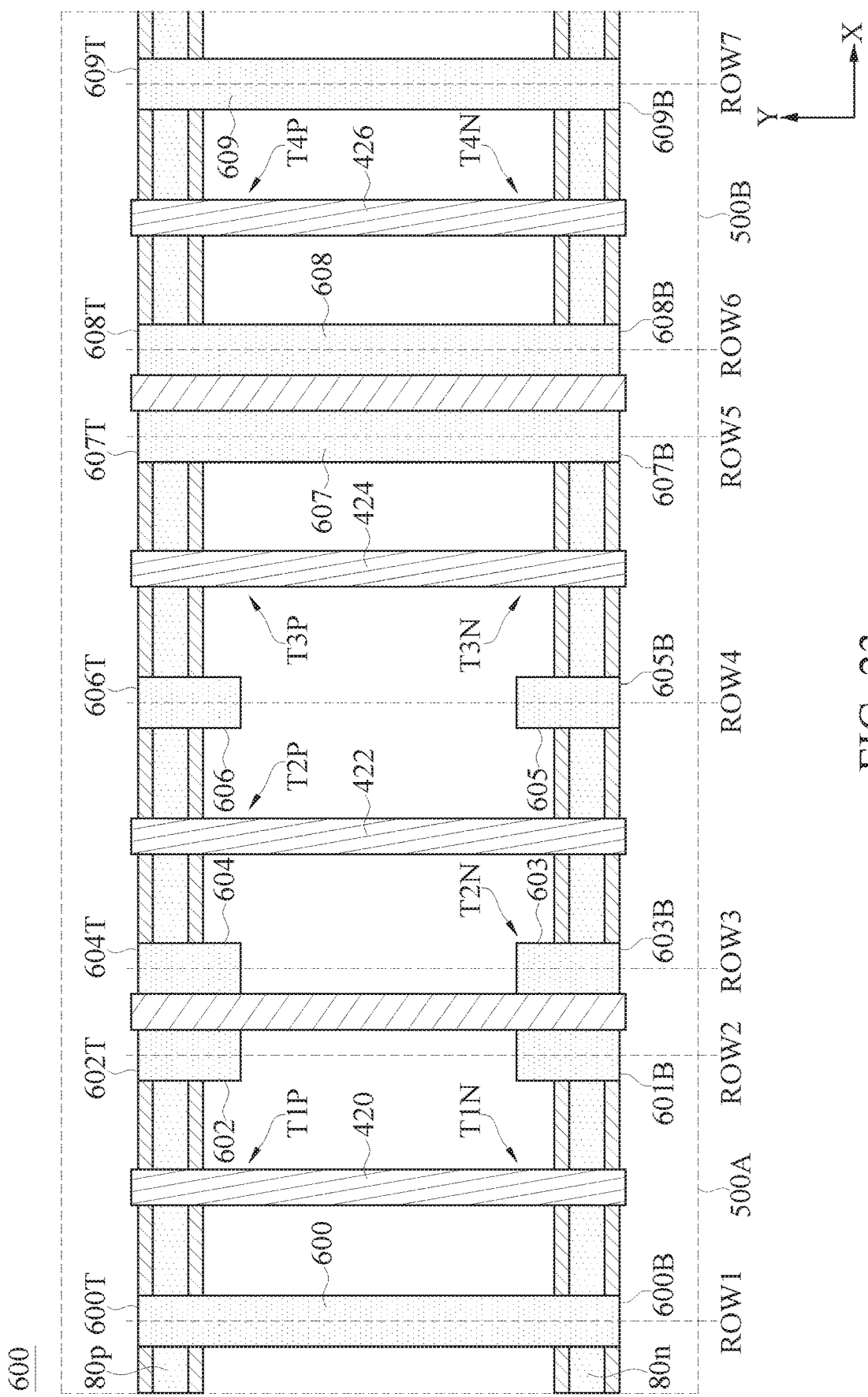
FIG. 23 is a schematic diagram of layout designs for a semiconductor device, in accordance with some embodiments.

FIG. 23 is a schematic diagram of layout designs for a semiconductor device 600, in accordance with some embodiments. Referring to FIG. 23, the layout design for the semiconductor device 600 is similar to that for the semiconductor device 500 described and illustrated with reference to FIG. 22 except that, the semiconductor device 600 includes a conductive segment 600 in a row ROW1, conductive segments 601 and 602 in a row ROW2, conductive segments 603 and 604 in a row ROW3, conductive segments 605 and 606 in a ROW4, a conductive segment 607 in a row ROW5, a conductive segment 608 in a row ROW6, a conductive segment 609 in a row ROW7, and gate-strips 420, 422, 424 and 426. The rows ROW1 to ROW7 are arranged in the X-direction.

The gate-strip 420, the conductive segments 600 and 602, and a p-type active region 80p defines a p-type transistor T1P. The gate-strip 422, the conductive segments 604 and 606, and the p-type active region 80p define the p-type transistor T2P. The gate-strip 424, the conductive segments 606 and 607, and the p-type active region 80p define a p-type transistor T3P. The gate-strip 426, the conductive segments 608 and 609, and the p-type active region 80p define a p-type transistor T4P.

The gate-strip 420, the conductive segments 600 and 601, and an n-type active region 80n define an n-type transistor T1N. The gate-strip 422, the conductive segments 603 and 605, and the n-type active region 80n define an n-type transistor T2N. The gate-strip 424, the conductive segments 605 and 607, and the n-type active region 80n define an n-type transistor T3N. The gate-strip 426, the conductive segments 608 and 609, and the n-type active region 80p define an n-type transistor T4N.

The transistors T1P and T1N share the common conductive segment 600. The transistors T3P and T3N share the common conductive segment 607. The transistors T4P and T4N share the common conductive segments 608 and 609.

A short side of a conductive segment in each of the rows ROW1 to ROW7 is leveled with each other. For example, short sides 600T, 602T, 604T, 606T, 607T, 608T, and 609T are leveled with each other in the Y-direction. Similarly, short sides 600B, 601B, 603B, 605B, 607B, 608B, and 609B are leveled with each other in the Y-direction. Such approach for arranging conductive segments can be applied to any of the aforesaid embodiments.

Figure 24:
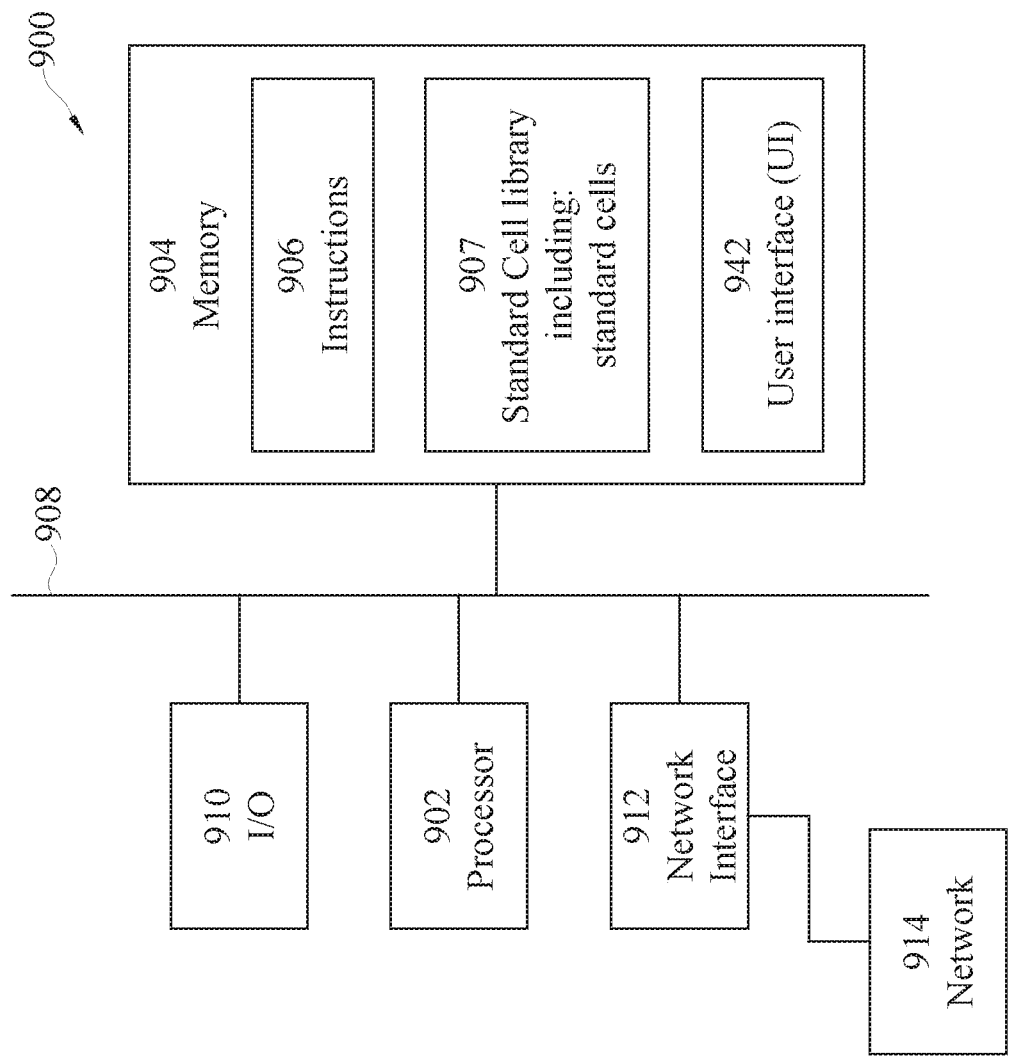
FIG. 24 is a block diagram of an electronic design automation (EDA) system in accordance with some embodiments.

FIG. 24 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of, e.g., the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 25:
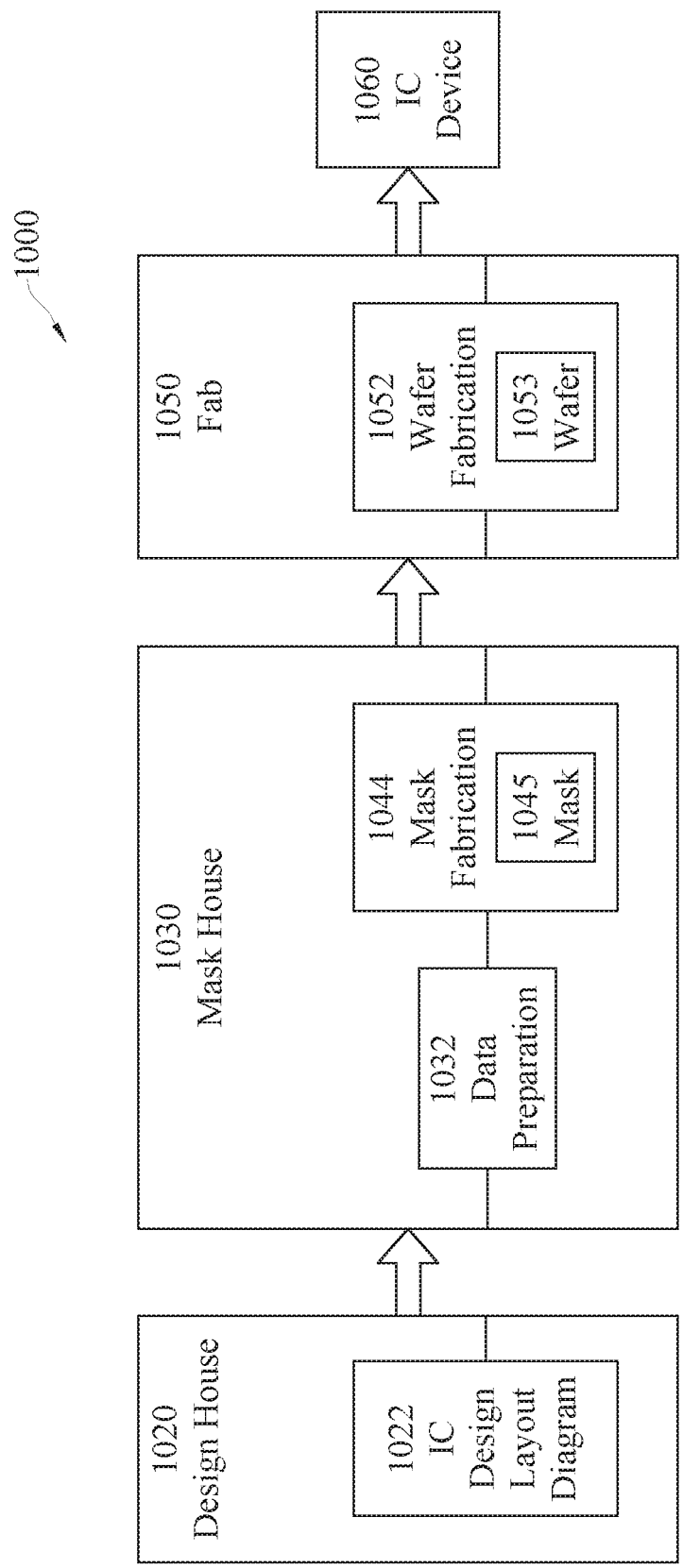
FIG. 25 is a block diagram of an integrated circuit (IC) manufacturing system, and an IC manufacturing flow associated therewith, in accordance with some embodiments.

FIG. 25 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 25, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 25, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (ebeam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (backend-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., system 1000 of FIG. 24), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, the present disclosure provides a semiconductor device including a dielectric layer having a first surface and a second surface opposite to the first surface; an active region on the first surface of the dielectric layer; a power rail under the second surface of the dielectric layer, wherein the dielectric layer is between the active region and the power rail; a spacer physically dividing the active region into a first part and a second part, the first part and the second part being conductively isolated from each other by the spacer; an intermediate layer comprising: first and second conductive segments; and wherein the spacer joins the first conductive segment and the second conductive segment, and electrically isolates the first conductive segment from the second conductive segment, wherein a join length between the first conductive segment and the spacer is equal to a join length between the second conductive segment and the spacer.

In some embodiments, the present disclosure also provides a semiconductor device including a dielectric layer; an active region on the dielectric layer; a spacer physically dividing the active region into a first part and a second part, the first part and the second part being conductively isolated from each other by the spacer; a first transistor in the first part of the active region; a second transistor in the second part of the active region; a first conductive segment and a second conductive segment associated with the first transistor and the second transistor, respectively, wherein the spacer joins the first conductive segment and the second conductive segment, and electrically isolates the first conductive segment from the second conductive segment; and a power rail being overlapped with the active region.

In some embodiments, the present disclosure provides a method of generating, by a processor, a layout design of a semiconductor device, the method including: creating an active region pattern, extending in a first direction, that specifies an active region in a semiconductor substrate; creating two intermediate layer patterns, extending in the second direction perpendicular to the first direction for a same extension length, over the active region pattern, wherein the two intermediate layer patterns specify two conductive segments in a intermediate layer, wherein the intermediate layer is a layer between the active region and a metal layer, with the metal layer overlying an inter layer dielectric layer on the channel region; creating a spacer pattern, extending in the second direction, jointing the two intermediate layer patterns, and dividing the active region pattern into a first part and a second part, wherein the spacer pattern specifies a spacer that conductively isolates the two conductive segments from each other in the intermediate layer and conductively isolates the first part of the active region from the second part of the active region in the semiconductor substrate; and creating a power rail pattern overlapping with the active region pattern, wherein the power rail pattern specifies a power rail coupled to the two conductive segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a dielectric layer having a first surface and a second surface opposite to the first surface;
   an active region on the first surface of the dielectric layer;
   a power rail under the second surface of the dielectric layer, wherein the dielectric layer is between the active region and the power rail;
   a spacer physically dividing the active region into a first part and a second part, the first part and the second part being conductively isolated from each other by the spacer;

an intermediate layer comprising:
  a first conductive segment and a second conductive segment; and
  wherein the spacer joins the first conductive segment and the second conductive segment, and electrically isolates the first conductive segment from the second conductive segment,
  wherein a join length between the first conductive segment and the spacer is equal to a join length between the second conductive segment and the spacer.

2. The semiconductor device according to claim 1, wherein the power rail is coupled to the first conductive segment.

3. The semiconductor device according to claim 2, wherein the active region overlaps with the power rail.

4. The semiconductor device according to claim 1, wherein the intermediate layer is over the dielectric layer, and the active region is between the intermediate layer and the dielectric layer.

5. The semiconductor device according to claim 4, wherein the intermediate layer is between a metal layer and the active region.

6. The semiconductor device according to claim 5, wherein the intermediate layer is in an inter layer dielectric layer over the first surface of the dielectric layer.

7. The semiconductor device according to claim 6, wherein the metal layer extends above the inter layer dielectric layer and the intermediate layer.

8. The semiconductor device according to claim 1, wherein the first conductive segment and the second conductive segment are leveled with each other.

9. The semiconductor device according to claim 1, wherein the spacer is in contact with the first surface of the dielectric layer.

10. The semiconductor device according to claim 1, further comprising:
  a gate-strip over the dielectric layer, wherein the first conductive segment is between the gate-strip and the spacer.

11. A semiconductor device, comprising:
  a dielectric layer;
  an active region on the dielectric layer;
  a spacer physically dividing the active region into a first part and a second part, the first part and the second part being conductively isolated from each other by the spacer;
  a first transistor in the first part of the active region;
  a second transistor in the second part of the active region;
  a first conductive segment and a second conductive segment associated with the first transistor and the second transistor, respectively, wherein the spacer joins the first conductive segment and the second conductive segment, and electrically isolates the first conductive segment from the second conductive segment; and
  a power rail being overlapped with the active region.

12. The semiconductor device according to claim 11, further comprising:
  a first gate-strip covering a channel region of the first transistor, wherein the power rail is overlapped with the channel region of the first transistor.

13. The semiconductor device according to claim 12, wherein the first conductive segment is disposed over a doped region, immediately adjacent to the channel region of the first transistor, of the first transistor, and the second conductive segment is disposed over a doped region, immediately adjacent to the channel region of the second transistor, of the second transistor, wherein the power rail is overlapped with the doped region of the first transistor and the doped region of the second transistor.

14. The semiconductor device according to claim 11, wherein the dielectric layer has a first surface and a second surface opposite to each other,
  wherein the active region is disposed on the first surface of the dielectric layer, and the power rail is disposed under the second surface of the dielectric layer.

15. The semiconductor device according to claim 14, wherein the first conductive segment and the second conductive segment are in an intermediate layer,
  wherein the intermediate layer is over the dielectric layer, and the active region is between the intermediate layer and the dielectric layer.

16. The semiconductor device according to claim 15, wherein the active region is between the intermediate layer and the power rail.

17. The semiconductor device according to claim 16, further comprising:
  a first cell having at least one logic function;
  a second cell having at least one logic function; and
  wherein the first transistor is located inside the first cell and the second transistor is located inside the second cell.

18. The semiconductor device according to claim 17, wherein the spacer is located at a boundary separating the first cell from the second cell.

19. The semiconductor device according to claim 16, further comprising:
  a cell having at least one logic function,
  wherein the first transistor, the second transistor and the spacer are located in the cell.

20. A method of generating, by a processor, a layout design of a semiconductor device, the method comprising:
  creating an active region pattern, extending in a first direction, that specifies an active region in a semiconductor substrate;
  creating two intermediate layer patterns, extending in a second direction perpendicular to the first direction for a same extension length, over the active region pattern, wherein the two intermediate layer patterns specify two conductive segments in an intermediate layer, wherein the intermediate layer is a layer between the active region and a metal layer, with the metal layer overlying an inter layer dielectric layer on a channel region;
  creating a spacer pattern, extending in the second direction, jointing the two intermediate layer patterns, and dividing the active region pattern into a first part and a second part, wherein the spacer pattern specifies a spacer that conductively isolates the two conductive segments from each other in the intermediate layer and conductively isolates the first part of the active region from the second part of the active region in the semiconductor substrate;
  creating a power rail pattern overlapping with the active region pattern, wherein the power rail pattern specifies a power rail coupled to the two conductive segments; and
  manufacturing the semiconductor device according to the layout design.

* * * * *